(12) United States Patent
Oda et al.

(10) Patent No.: US 12,256,520 B2
(45) Date of Patent: Mar. 18, 2025

(54) WICK SHEET FOR VAPOR CHAMBER, VAPOR CHAMBER, AND ELECTRONIC APPARATUS

(71) Applicant: DAI NIPPON PRINTING CO., LTD., Tokyo-to (JP)

(72) Inventors: Kazunori Oda, Tokyo-to (JP); Toshihiko Takeda, Tokyo-to (JP); Shinichiro Takahashi, Tokyo-to (JP); Takayuki Ota, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 284 days.

(21) Appl. No.: 17/789,695

(22) PCT Filed: Jan. 8, 2021

(86) PCT No.: PCT/JP2021/000478
§ 371 (c)(1),
(2) Date: Jun. 28, 2022

(87) PCT Pub. No.: WO2021/141110
PCT Pub. Date: Jul. 15, 2021

(65) Prior Publication Data
US 2023/0026517 A1     Jan. 26, 2023

(30) Foreign Application Priority Data
Jan. 10, 2020   (JP) ................................. 2020-003029

(51) Int. Cl.
*H05K 7/20*     (2006.01)
(52) U.S. Cl.
CPC ............................... *H05K 7/20336* (2013.01)

(58) Field of Classification Search
CPC .. H05K 7/20336; H05K 7/2029; F28D 15/02; F28D 15/04; F28D 15/0233; F28D 15/046; H01L 23/427
See application file for complete search history.

(56) References Cited

U.S. PATENT DOCUMENTS 8,256,501 B2 *  9/2012  Nagai ................. F28D 15/0233
                                                  165/80.4
9,854,705 B2 * 12/2017  Honmura ........... F28D 15/0233
(Continued)

FOREIGN PATENT DOCUMENTS

JP     2008-082698 A    4/2008
JP     2019-039662 A    3/2019
(Continued)

OTHER PUBLICATIONS

Feb. 22, 2021 International Search Report issued in International Patent Application No. PCT/JP2021/000478.
(Continued)

*Primary Examiner* — Nelson J Nieves
(74) *Attorney, Agent, or Firm* — Oliff PLC

(57) ABSTRACT

A wick sheet for a vapor chamber includes a sheet body having a first body surface and a second body surface, a first vapor flow channel portion, a liquid flow channel portion provided on the second body surface, and the second vapor flow channel portion provided on the first body surface. The sheet body includes a land portion having the longitudinal direction being a first direction, and the first vapor flow channel portion is disposed around the land portion. The second vapor flow channel portion includes a vapor flow channel groove extending from one of side edges of the land portion to the other side edge in a second direction orthogonal to the first direction.

15 Claims, 12 Drawing Sheets

(56) References Cited

U.S. PATENT DOCUMENTS

| | | | | |
|---|---|---|---|---|
| 2017/0023308 A1* | 1/2017 | Huang | | F28F 3/00 |
| 2017/0350657 A1* | 12/2017 | Yeh | | F28D 15/046 |
| 2018/0156545 A1* | 6/2018 | Delano | | F28D 15/043 |
| 2018/0164043 A1* | 6/2018 | Kurashima | | F28D 15/02 |
| 2020/0404802 A1* | 12/2020 | Takahashi | | H05K 7/20309 |
| 2021/0168969 A1* | 6/2021 | Takahashi | | H05K 7/20318 |
| 2024/0151481 A1* | 5/2024 | Kawamura | | F28F 1/32 |

FOREIGN PATENT DOCUMENTS

| | | | |
|---|---|---|---|
| JP | 2019-143960 A | | 8/2019 |
| JP | 2019-178860 A | | 10/2019 |
| KR | 20110103387 A | * | 9/2011 |

OTHER PUBLICATIONS

Jul. 12, 2022 International Preliminary Report on Patentability issued in International Patent Application No. PCT/JP2021/000478.

* cited by examiner

WICK SHEET FOR VAPOR CHAMBER, VAPOR CHAMBER, AND ELECTRONIC APPARATUS

TECHNICAL FIELD

The present invention relates to a wick sheet for a vapor chamber, a vapor chamber, and an electronic apparatus.

BACKGROUND ART

An electronic device that generates heat is used in an electronic apparatus, such as a mobile terminal. Examples of an electronic device include a central processing unit (CPU), a light-emitting diode (LED), and a power semiconductor. Examples of a mobile terminal include a portable terminal and a tablet.

The electronic device is cooled by a heat dissipation device, such as a heat pipe (refer to, for example, Patent Literature 1). The demand for thin heat dissipation devices has been increasing in recent years to make an electronic apparatus thinner. Vapor chambers, which are thinner than heat pipes, are being developed as heat dissipation devices. The vapor chamber cools electronic devices by using working fluid that is enclosed in the vapor chamber and that absorbs and dissipates the heat of the electronic devices.

More specifically, the working liquid in the vapor chamber receives heat from an electronic device at a portion (an evaporation portion) of the vapor chamber in the vicinity of the electronic device. In this manner, the working fluid evaporates and turns into working vapor. The working vapor is diffused in a vapor flow channel portion formed in the vapor chamber in a direction away from the evaporation portion and, thus, is cooled. Then, the working vapor condenses and turns into working liquid. The vapor chamber includes a liquid flow channel portion functioning as a capillary structure (also referred to as a "wick"). Accordingly, the working fluid enters the liquid flow channel portion from the vapor flow channel portion. Thereafter, the working liquid flows through the liquid flow channel portion and is delivered toward the evaporation portion. The working liquid delivered to the evaporation portion receives heat in the evaporation portion and evaporates again. In this way, the working fluid refluxes in the vapor chamber while repeating the phase change, that is, evaporation and condensation. As described above, the working fluid dissipates the heat of the electronic device. As a result, the heat dissipation efficiency of the vapor chamber is increased.

PATENT LITERATURE 1

Japanese Patent Laid-Open No. 2008-82698

DISCLOSURE OF THE INVENTION

The present invention provides a wick sheet for a vapor chamber, a vapor chamber, and an electronic apparatus capable of improving the heat dissipation efficiency.

According to a first solution to the problem, the present invention provides a wick sheet for a vapor chamber. The vapor chamber encloses a working fluid. The wick sheet is sandwiched between a first sheet and a second sheet of the vapor chamber. The wick sheet includes a sheet body having a first body surface and a second body surface opposite the first body surface, a first vapor flow channel portion extending from the first body surface to the second body surface of the sheet body and allows vapor of the working fluid to pass through the first vapor flow channel portion, a liquid flow channel portion provided on the second body surface, where the liquid flow channel portion communicates with the first vapor flow channel portion and allows liquid of the working fluid to pass through the liquid flow channel portion, and a second vapor flow channel portion provided on the first body surface, where the second vapor flow channel portion communicates with the first vapor flow channel portion and allows the vapor of the working fluid to pass therethrough. The sheet body includes a land portion having a longitudinal direction being a first direction, and the first vapor flow channel portion is disposed around the land portion. The second vapor flow channel portion includes a vapor flow channel groove extending from one of side edges of the land portion to the other of the side edges in a second direction orthogonal to the first direction.

In the wick sheet for a vapor chamber according to the first solution described above, the second vapor flow channel portion may include a plurality of the vapor flow channel grooves, and a vapor flow channel convex portion in contact with the first sheet may be provided between two of the vapor flow channel grooves adjacent to each other.

In the wick sheet for a vapor chamber according to the first solution described above, the second vapor flow channel portion may include a vapor flow channel connection groove that is disposed on the vapor flow channel convex portion and that allows the two of the vapor flow channel grooves adjacent to each other to communicate with each other.

In the wick sheet for a vapor chamber according to the first solution described above, the vapor flow channel connection groove provided on one of the vapor flow channel convex portions adjacent to each other and the vapor flow channel connection groove provided on the other of the vapor flow channel convex portions may be disposed at positions different from positions at which the two of the vapor flow channel connection grooves overlap as viewed in the first direction.

In the wick sheet for a vapor chamber according to the first solution described above, the vapor flow channel connection groove provided on one of the vapor flow channel convex portions adjacent to each other and the vapor flow channel connection groove provided on the other of the vapor flow channel convex portions may be disposed at positions at which the two of the vapor flow channel connection grooves overlap as viewed in the first direction.

In the wick sheet for a vapor chamber according to the first solution described above, the sheet body may include a plurality of the land portions. The second vapor flow channel portion may be provided in each of the land portions. The vapor flow channel groove of one of two of the land portions adjacent to each other in the second direction and the vapor flow channel groove of the other of the two of the land portions may be disposed at positions at which the two of the vapor flow channel grooves overlap as viewed in the second direction.

In the wick sheet for a vapor chamber according to the first solution described above, the second vapor flow channel portion may be disposed on one side of the land portion in the first direction.

In the wick sheet for a vapor chamber according to the first solution described above, an end edge convex portion in contact with the first sheet may be provided between the vapor flow channel groove of the second vapor flow channel portion and one of two end edges of the land portion in the first direction, the one of two end edges being located on a side on which the second vapor flow channel portion is disposed.

The wick sheet for a vapor chamber according to the first solution described above may further include a communication portion that is provided in the sheet body and that communicates with the liquid flow channel portion and the second vapor flow channel portion.

In the wick sheet for a vapor chamber according to the first solution described above, the communication portion may include a through-hole that penetrates the sheet body and that extends from the liquid flow channel portion to the vapor flow channel groove.

In the wick sheet for a vapor chamber according to the first solution described above, the liquid flow channel portion may include a plurality of liquid flow channel mainstream grooves that extend in the first direction and that allows liquid of the working fluid to pass through the liquid flow channel mainstream grooves and a liquid flow channel connection groove that extends in a direction different from the first direction and that communicates with the liquid flow channel mainstream grooves. Each of the liquid flow channel mainstream grooves may further include a liquid flow channel intersection portion that communicates with the liquid flow channel connection groove, and the through-hole may extend to the liquid flow channel intersection portion and the vapor flow channel groove.

According to a second solution to the problem, the present invention provides a wick sheet for a vapor chamber. The vapor chamber encloses a working fluid, and the wick sheet is sandwiched between a first sheet and a second sheet of the vapor chamber. The wick sheet includes a sheet body having a first body surface and a second body surface opposite the first body surface, a penetration space extending from the first body surface to the second body surface of the sheet body, a first body surface groove portion provided on the first body surface, where the first body surface groove portion communicates with the penetration space, and a second body surface groove portion provided on the second body surface, where the second body surface groove portion communicates with the penetration space. The sheet body includes a land portion having a longitudinal direction being the first direction, and the penetration space is disposed around the land portion. The first body surface groove portion includes a first groove that extends one of side edges of the land portion to the other of the side edges in a second direction orthogonal to the first direction. The second body surface groove portion includes a second groove extending in the first direction, and a dimension of the first groove in the first direction is greater than a dimension of the second groove in the second direction.

According to a third solution to the problem, the present invention provides a vapor chamber. The vapor chamber includes a first sheet, a second sheet, and the wick sheet for a vapor chamber according to one of the above-described first solution and second solution, where the wick sheet for a vapor chamber is sandwiched between the first sheet and the second sheet.

According to a fourth solution, the present invention provides a vapor chamber. The vapor chamber includes a first sheet, a second sheet, the wick sheet for a vapor chamber according to the above-described first solution, where the wick sheet is sandwiched between the first sheet and the second sheet, and an evaporation region in which the working fluid evaporates. The second vapor flow channel portion is disposed in the evaporation region.

According to a fifth solution, the present invention provides an electronic apparatus. The electronic apparatus includes a housing, a device housed in the housing, and the vapor chamber according to one of the above-described third solution and the fourth solution. The vapor chamber is in thermal contact with the device.

According to the present invention, the heat dissipation efficiency can be improved.

DESCRIPTION OF EMBODIMENTS

Figure 1:
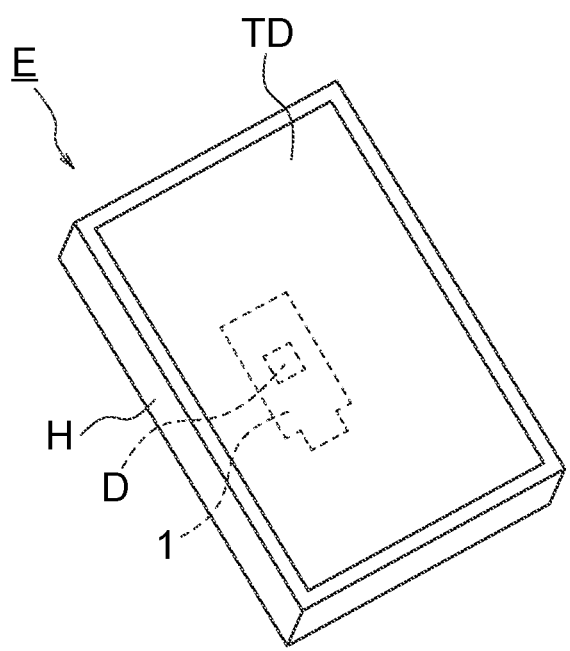
FIG. 1 is a schematic perspective view of an electronic apparatus according to an embodiment of the present invention.

Embodiments of the present invention are described below with reference to the accompanying drawings. Note that in the drawings attached hereto, for ease of illustration and understanding, the scale, the aspect ratio, and the like are changed from the actual ones and are exaggerated as appropriate.

As used herein, the geometrical conditions, physical properties, the terms identifying the degrees of the geometrical conditions or physical properties, and numerical values indicating the geometrical conditions or physical properties are not defined strictly. Accordingly, these geometric conditions, physical properties, terms, and numerical values shall be interpreted to include the extent to which similar functions can be expected. Examples of a term that identifies geometric conditions include "length", "angle", "shape", and "arrangement". Examples of a term that identifies geometric conditions include "parallel", "orthogonal", and "identical". In addition, for clarity of the drawings, the shapes of a plurality of portions that could be expected to function in a similar manner are illustrated in a regular manner. However, the shapes need not be defined strictly, and the shapes of the portions may differ from one another if the portions function as expected. Furthermore, in the drawings, a boundary line indicating the joint surfaces of members and the like are denoted by a straight line for simplicity, but it is not limited to a strict straight line, and any shape of the boundary line may be employed if the joint surfaces provide the expected joint performance.

A wick sheet for a vapor chamber, a vapor chamber, and an electronic apparatus according to an embodiment of the present invention are described below with reference to FIGS. 1 to 21. A vapor chamber 1 according to the present embodiment is housed in a housing H of an electronic apparatus E together with an electronic device D that generates heat. The vapor chamber 1 is a device for cooling the electronic device D. An example of the electronic apparatus E is a mobile terminal, such as a portable terminal or a tablet. Examples of the electronic device D include a central processing unit (CPU), a light emitting diode (LED), and a power semiconductor. The electronic device D is also referred to as a "device to be cooled".

The electronic apparatus E including the vapor chamber 1 according to the present embodiment is described first with reference to a tablet as an example. As illustrated in FIG. 1, the electronic apparatus E includes the housing H and the electronic device D and a vapor chamber 1 housed in the housing H. The electronic apparatus E illustrated in FIG. 1 is provided with a touch panel display TD on the front surface of the housing H. The vapor chamber 1 is housed in the housing H and is disposed so as to be in thermal contact with the electronic device D. This allows the vapor chamber 1 to receive the heat generated by the electronic device D when the electronic apparatus E is in use. The heat received by the vapor chamber 1 is dissipated to the outside of the vapor chamber 1 via working fluids 2a and 2b (described below). In this manner, the electronic device D is effectively cooled. If the electronic apparatus E is a tablet, the electronic device D corresponds to the central processing unit or the like.

Figure 2:
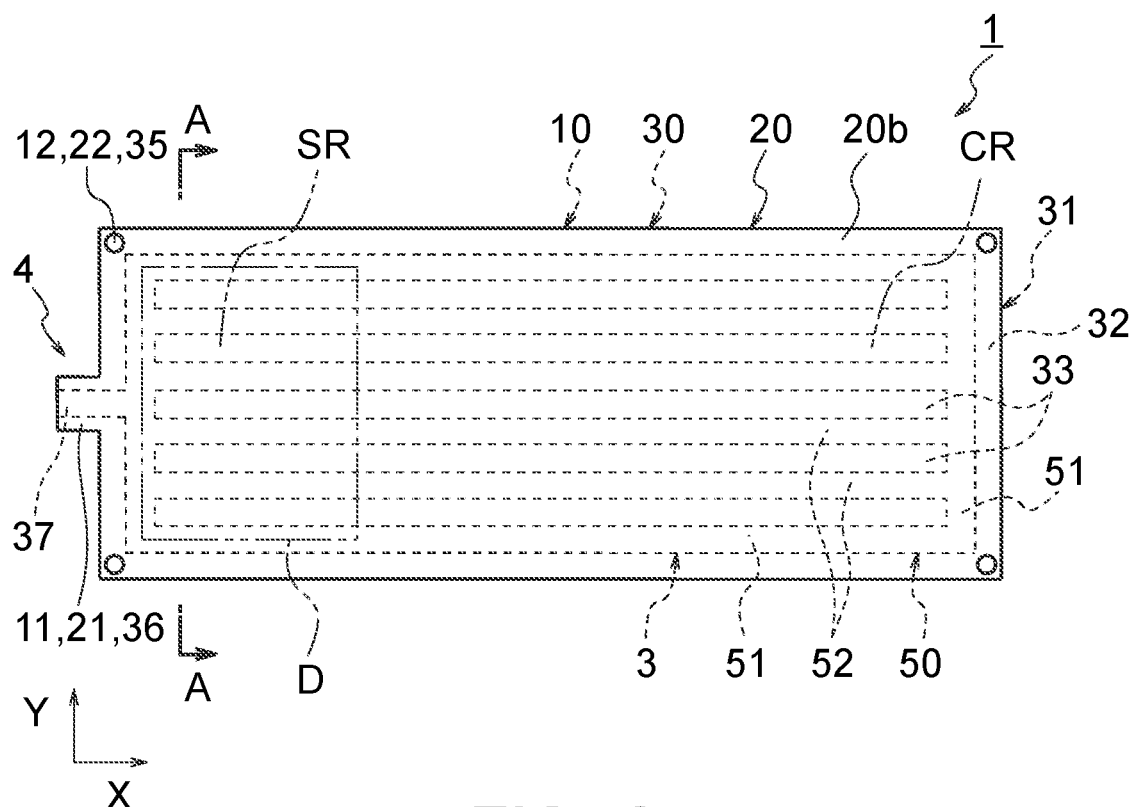
FIG. 2 is a top view of a vapor chamber according to the embodiment of the present invention.
Figure 3:
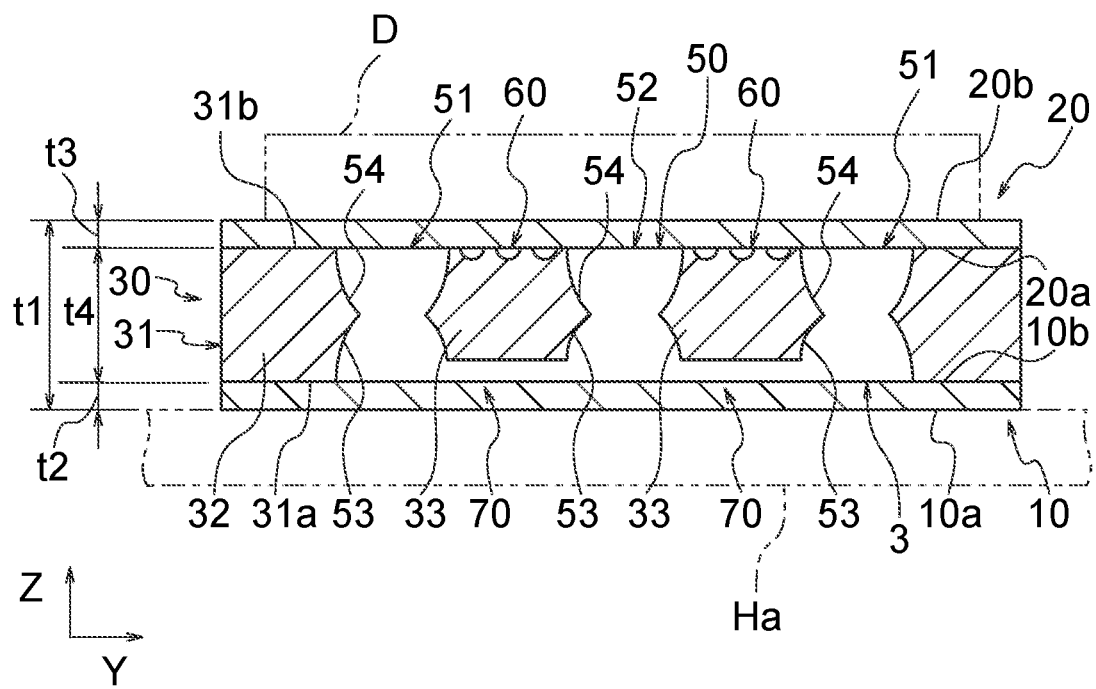
FIG. 3 is a sectional view of the vapor chamber taken along line A-A of FIG. 2.

The vapor chamber 1 according to the present embodiment is described below. As illustrated in FIGS. 2 and 3, the vapor chamber 1 has a sealed space 3 in which the working fluids 2a and 2b are enclosed, and the phase changes of the working fluids 2a and 2b in the sealed space 3 are repeated. Thus, the electronic device D of the electronic apparatus E described above is cooled. Examples of the working fluids 2a and 2b include pure water, ethanol, methanol, acetone, and any mixture thereof. The working fluids 2a and 2b may have freezing-expansion property. That is, the working fluids 2a and 2b may be fluids that exhibit expansion upon freezing. Examples of working fluids 2a and 2b that exhibit expansion upon freezing include pure water and an aqueous solution of pure water and an additive, such as alcohol.

As illustrated in FIGS. 2 and 3, the vapor chamber 1 has a lower sheet 10, an upper sheet 20, and a wick sheet 30 for a vapor chamber. The lower sheet 10 is an example of a first sheet. The upper sheet 20 is an example of a second sheet. The wick sheet 30 for a vapor chamber is sandwiched between the lower sheet 10 and the upper sheet 20. Hereinafter, the wick sheet 30 for a vapor chamber is simply referred to as a wick sheet 30. According to the present embodiment, the lower sheet 10, the wick sheet 30, and the upper sheet 20 are stacked in this order.

The vapor chamber 1 is formed in the shape of a substantially thin, flat plate. The vapor chamber 1 may have any planar shape, and the planar shape of the vapor chamber 1 may be rectangular as illustrated in FIG. 2. For example, the planar shape of the vapor chamber 1 may be a rectangle with one side of length 1 cm and adjacent side of length 3 cm, or a square with a side length of 15 cm. The vapor chamber 1 may have any planar dimensions. The present embodiment is described below with reference to the vapor chamber 1 having a rectangular planar shape with the longitudinal direction being the X direction (described below). In this case, as illustrated in FIGS. 4 to 7, the lower sheet 10, upper sheet 20, and wick sheet 30 may have the same planar shape as the vapor chamber 1. Note that the planar shape of the vapor chamber 1 is not limited to a rectangle but instead may be any shape, such as a circle, an ellipse, L shape, or T shape.

As illustrated in FIG. 2, the vapor chamber 1 has an evaporation region SR in which the working fluids 2a and 2b evaporate and a condensation region CR in which the working fluids 2a and 2b condense.

The evaporation region SR overlaps the electronic device D in plan view and is the region where the electronic device D is mounted. The evaporation region SR can be disposed anywhere in the vapor chamber 1. According to the present embodiment, the evaporation region SR is formed on one side of the vapor chamber 1 in the X direction (the left side in FIG. 2). Heat is transferred from the electronic device D to the evaporation region SR, and the heat causes the liquid of the working fluid to evaporate in the evaporation region SR. The heat from the electronic device D may be transferred not only to the region that overlaps the electronic device D in plan view, but also to a region around the region that the electronic device D overlaps. Accordingly, the evaporation region SR includes the region that overlaps the electronic device D and a region around the region overlapping the electronic device D in plan view. As used herein, the term "plan view" is referred to a view viewed in the direction orthogonal to a surface of the vapor chamber 1 that receives the heat from the electronic device D and a surface that dissipates the received heat. The surface that receives heat corresponds to a second upper sheet surface 20b of the upper sheet 20 (described below). The surface that dissipates heat corresponds to a first lower sheet surface 10a of the lower sheet 10 (described below). For example, as illustrated in FIG. 2, the view of the vapor chamber 1 viewed from above or from below corresponds to the plan view. The vapor of the working fluid is referred to as "working vapor 2a", and the liquid of the working fluid is referred to as "working liquid 2b".

The condensation region CR is a region that does not overlap the electronic device D in plan view and is a region in which the working vapor 2a mainly dissipates heat and condenses. The condensation region CR can be referred to as a region surrounding the evaporation region SR. In the condensation region CR, the heat from the working vapor 2a is dissipated to the lower sheet 10, and the working vapor 2a is cooled and condenses in the condensation region CR.

When the vapor chamber 1 is mounted inside a tablet, the vertical relationship may not be maintained depending on the posture of the tablet. However, according to the present embodiment, for convenience, the sheet that receives heat from the electronic device D is referred to as the upper sheet 20 described above, and the sheet that dissipates the received heat is referred to as the lower sheet 10 described above. Accordingly, the configuration of the vapor chamber 1 is described with reference to the lower sheet 10 disposed on the lower side and the upper sheet 20 disposed on the upper side.

Figure 4:
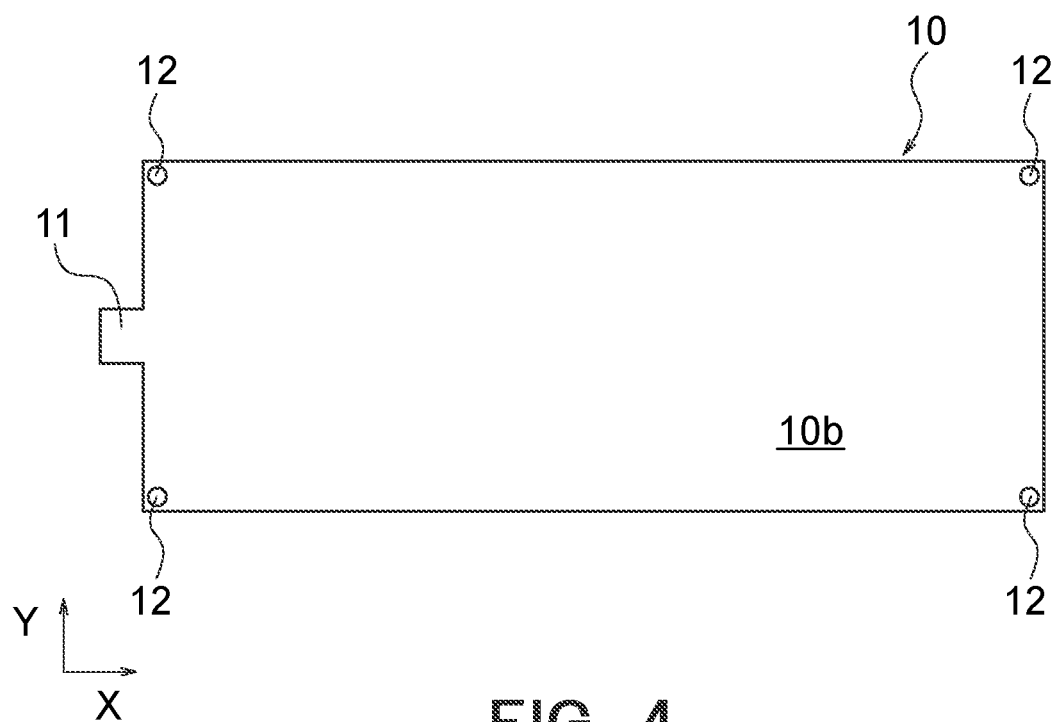
FIG. 4 is a top view of a lower sheet illustrated in FIG. 3.

As illustrated in FIG. 3, the lower sheet 10 has the first lower sheet surface 10a located remote from the wick sheet 30 and a second lower sheet surface 10b opposite the first lower sheet surface 10a. The second lower sheet surface 10b is disposed adjacent to the wick sheet 30. The entire lower sheet 10 may be formed as a flat sheet. The lower sheet 10 may have a constant thickness throughout its length. A housing member Ha that constitutes part of the housing H described above is attached to the first lower sheet surface 10a. The entire first lower sheet surface 10a may be covered with the housing member Ha. As illustrated in FIG. 4, an alignment hole 12 may be provided in each of the four corners of the lower sheet 10.

Figure 5:
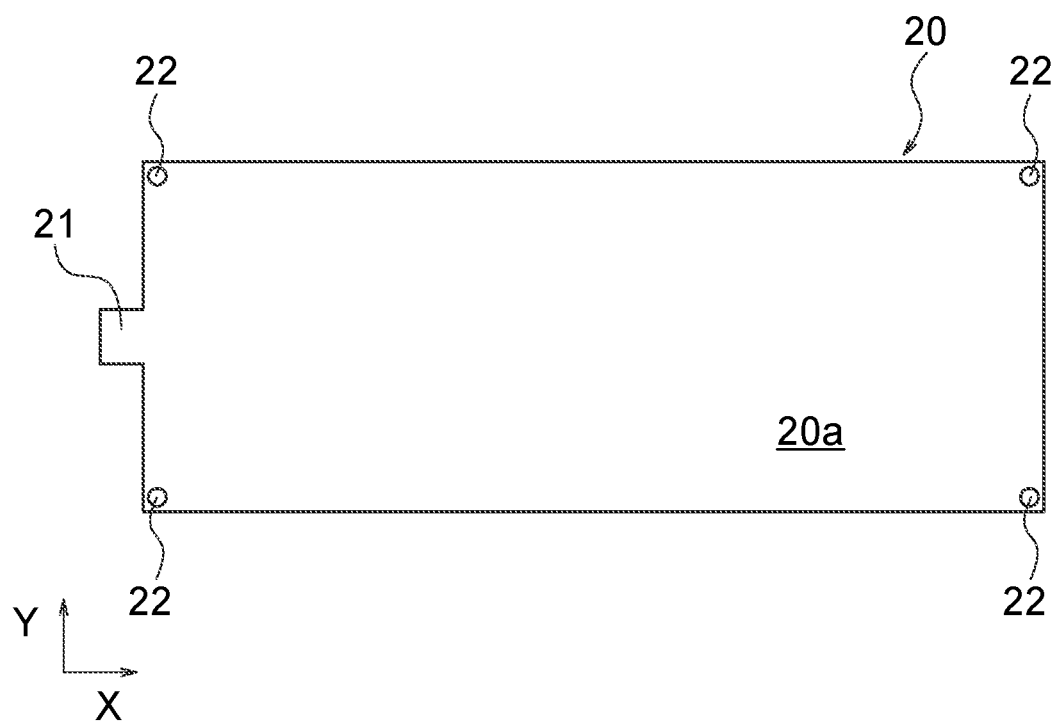
FIG. 5 is a bottom view of an upper sheet illustrated in FIG. 3.

As illustrated in FIG. 3, the upper sheet 20 has a first upper sheet surface 20a adjacent to the wick sheet 30 and a second upper sheet surface 20b opposite the first upper sheet surface 20a. The second upper sheet surface 20b is provided remote from the wick sheet 30. The entire upper sheet 20 may be formed as a flat sheet. The upper sheet 20 may have a constant thickness throughout its length. The electronic device D described above is attached to the second upper sheet surface 20b. As illustrated in FIG. 5, an alignment hole 22 may be provided in each of the four corners of the upper sheet 20.

As illustrated in FIG. 3, the wick sheet 30 includes a sheet body 31 and a first vapor flow channel portion 50, a liquid flow channel portion 60, and a second vapor flow channel portion 70 provided in the sheet body 31. The sheet body 31 has a first body surface 31a and a second body surface 31b opposite the first body surface 31a. The first body surface 31a is located adjacent to the lower sheet 10. The second body surface 31b is disposed adjacent to the upper sheet 20. The first vapor flow channel portion 50, the liquid flow channel portion 60, and the second vapor flow channel portion 70 constitute the sealed space 3 described above.

The second lower sheet surface 10b of the lower sheet 10 and the first body surface 31a of the sheet body 31 may be diffusion bonded to each other. The second lower sheet surface 10b and the first body surface 31a may be permanently bonded to each other. Similarly, the first upper sheet surface 20a of the upper sheet 20 and the second body surface 31b of the sheet body 31 may be diffusion bonded to each other. The first upper sheet surface 20a and the second body surface 31b may be permanently bonded to each other. Instead of using a diffusion bonding technique, the lower sheet 10, upper sheet 20, and wick sheet 30 may be bonded using another technique, such as brazing, as long as the sheets can be permanently bonded together. The term "permanently bonded" is not defined strictly. The term is used to mean that they are bonded to such a degree that the sealing of the sealed space 3 is maintained during the operation performed by the vapor chamber 1. It is only required that the lower sheet 10 and the wick sheet 30 are permanently bonded to maintain bonding between the lower sheet 10 and the wick sheet 30 during operation of the vapor chamber 1. It is only required that the upper sheet 20 and the wick sheet 30 are permanently bonded to maintain bonding between the upper sheet 20 and the wick sheet 30 during operation of the vapor chamber 1.

Figure 6:
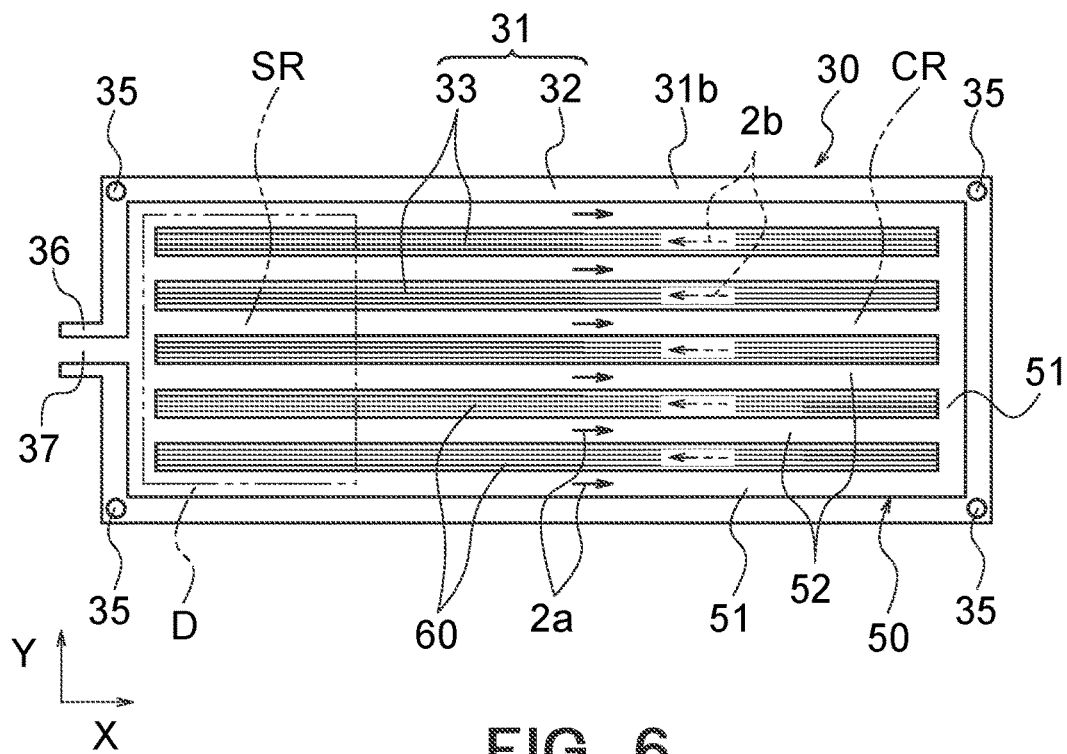
FIG. 6 is a top view of a wick sheet illustrated in FIG. 3.
Figure 7:
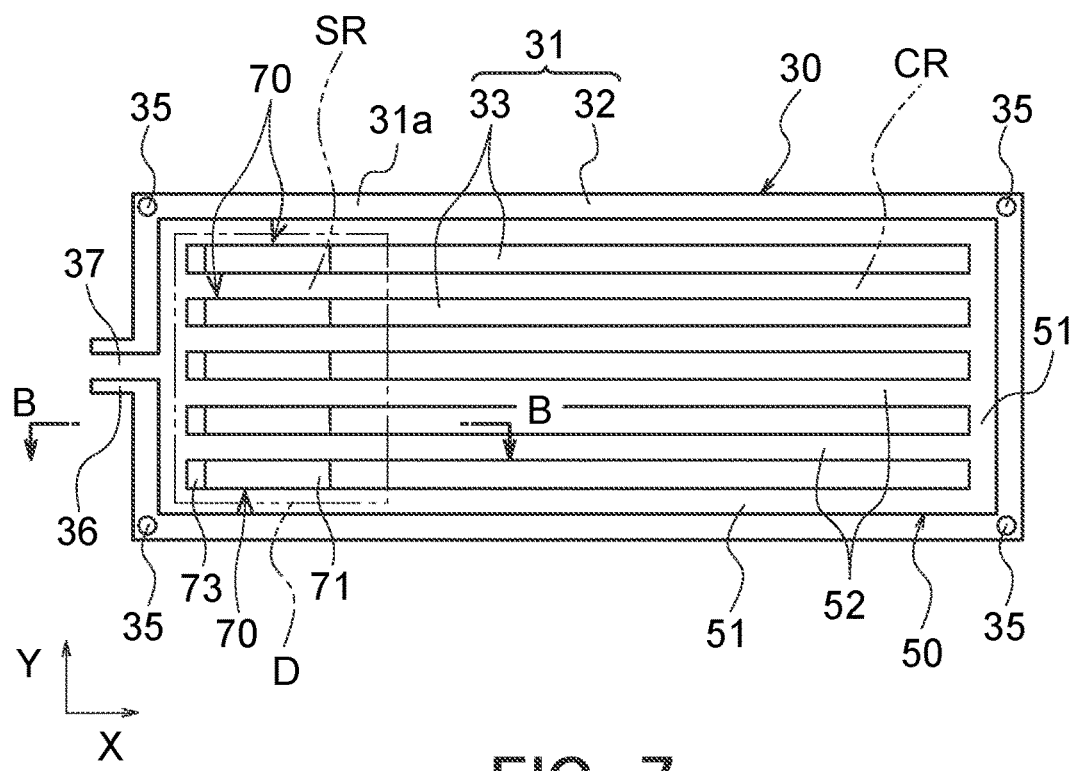
FIG. 7 is a bottom view of the wick sheet illustrated in FIG. 3.

The sheet body 31 of the wick sheet 30 according to the present embodiment includes a frame body portion 32 and a plurality of land portions 33. As illustrated in FIGS. 2, 6, and 7, the frame body portion 32 is formed in a rectangular frame shape in plan view. The land portion 33 is disposed inside the frame body portion 32. The frame body portion 32 and the land portions 33 are portions where the material of the wick sheet 30 remains without being etched in the etching process (described below). The first vapor flow channel portion 50 is defined inside the frame body portion 32. That is, the first vapor flow channel portion 50 is disposed inside of the frame body portion 32 and around each of the land portions 33. The working vapor 2a flows around each of the land portions 33

According to the present embodiment, each of the land portions 33 may extend in an elongated shape so that the longitudinal direction thereof is the X direction in plan view. The planar shape of the land portion 33 may be an elongated rectangular shape. The X direction is an example of a first direction. The X direction corresponds to the right-left direction in FIG. 6. In addition, the land portions 33 are equally spaced apart from each other in the Y direction. The Y direction is an example of a second direction. The Y direction corresponds to the up-down direction in FIG. 6. The land portions 33 may be arranged parallel to one another. The working vapor 2a flows around each of the land portions 33 and is delivered toward the condensation region CR. This inhibits the flow of the working vapor 2a from being obstructed. A width w1 of the land portion 33 (refer to FIG. 8) may be, for example, 100 μm to 1500 μm. Note that the width w1 of the land portion 33 is the dimension of the land portion 33 in the Y direction. The width w1 refers to the dimension at the position at which a penetration portion 34 (described below) is located in the thickness direction of the wick sheet 30.

The frame body portion 32 and the land portions 33 are diffusion bonded to the lower sheet 10 and to the upper sheet 20. Thus, the mechanical strength of the vapor chamber 1 can be increased. A wall surface 53a of a lower vapor flow channel recess 53 (described below) and a wall surface 54a of the upper vapor flow channel recess 54 (described below) constitute a side wall of the land portion 33. The first body surface 31a and the second body surface 31b of the sheet body 31 may be formed flat over the frame body portion 32 and the land portions 33.

The first vapor flow channel portion 50 is an example of a penetration space that penetrates the sheet body 31. The first vapor flow channel portion 50 is a flow channel through which mainly the working vapor 2a passes. The first vapor flow channel portion 50 extends from the first body surface 31a to the second body surface 31b and penetrates the sheet body 31 of the wick sheet 30. That is, the first vapor flow channel portion 50 is configured as a penetration space that extends from the first body surface 31a to the second body surface 31b.

As illustrated in FIGS. 6 and 7, the first vapor flow channel portion 50 according to the present embodiment has a first vapor passage 51 and a plurality of second vapor passages 52. The first vapor passage 51 is formed between the frame body portion 32 and each of the land portions 33. The first vapor passage 51 is formed in a continuous manner inside the frame body portion 32 and outside the land portion 33. The planar shape of the first vapor passage 51 is a rectangular frame shape. Each of the second vapor passages 52 is formed between two land portions 33 adjacent to each other. The planar shape of the second vapor passage 52 is an elongated rectangle. The first vapor flow channel portion 50 is partitioned into the first vapor passage 51 and the plurality of second vapor passages 52 by the plurality of land portions 33.

As illustrated in FIG. 3, the first vapor passage 51 and the second vapor passages 52 extend from the first body surface 31a to the second body surface 31b of the sheet body 31. Each of the first vapor passage 51 and the second vapor passage 52 is composed of the lower vapor flow channel recess 53 on the first lower sheet surface 10a and the upper vapor flow channel recess 54 on the upper sheet surface 20b. The lower vapor flow channel recess 53 communicates with the upper vapor flow channel recess 54 and, thus, each of the first vapor passage 51 and the second vapor passage 52 of the first vapor flow channel portion 50 extend from the first body surface 31a to the second body surface 31b.

Figure 8:
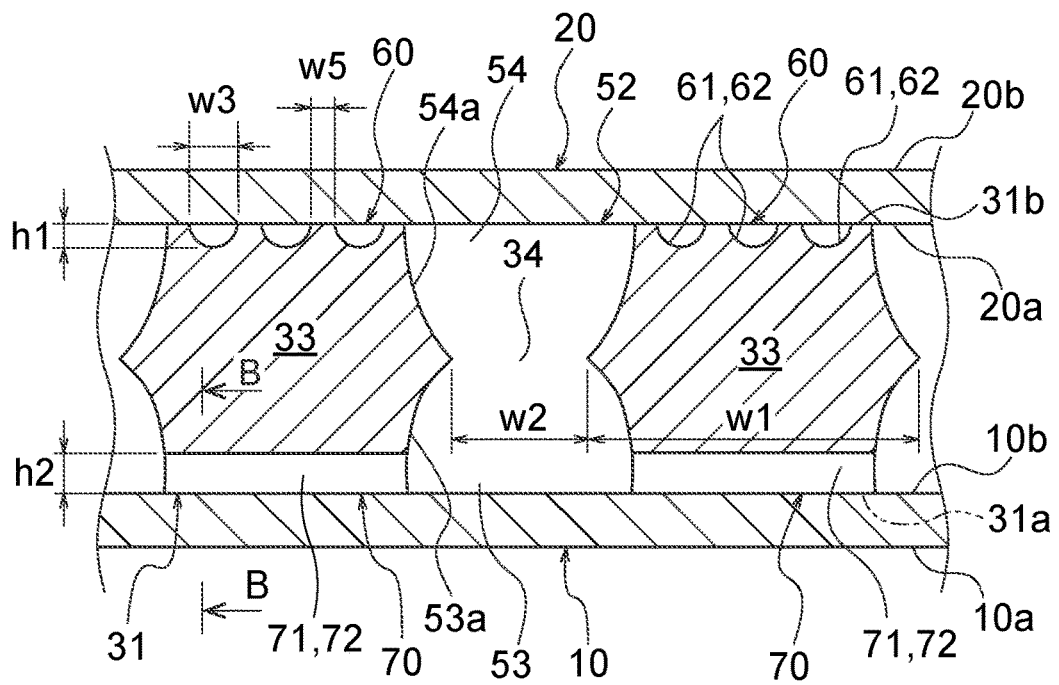
FIG. 8 is a partially enlarged sectional view of FIG. 3.

The lower vapor flow channel recess 53 is formed from the first body surface 31a of the wick sheet 30 through an etching process (described below). The lower vapor flow channel recess 53 having a concave shape is formed on the first body surface 31a. As a result, as illustrated in FIG. 8, the lower vapor flow channel recess 53 has the wall surface 53a that is curved. The wall surface 53a defines the lower vapor flow channel recess 53. In the section illustrated in FIG. 8, the wall surface 53a is curved so as to be closer to the facing wall surface 53a toward the second body surface 31b. The lower vapor flow channel recesses 53 formed in this manner constitute part (the lower half) of the first vapor passage 51 and part (the lower half) of the second vapor passage 52.

The upper vapor flow channel recess 54 is formed from the second body surface 31b of the wick sheet 30 through an etching process (described below). The upper vapor flow channel recess 54 having a concave shape is formed on the second body surface 31b. As a result, as illustrated in FIG. 8, the upper vapor flow channel recess 54 has the wall surface 54a that is curved. The wall surface 54a defines the upper vapor flow channel recess 54. In the section illustrated in FIG. 8, the wall surface 54a is curved so as to be closer to the facing wall surface 54a towards the first body surface 31a. The upper vapor flow channel recess 54 formed in this manner constitute part (the upper half) of the first vapor passage 51 and part (the upper half) of the second vapor passage 52.

As illustrated in FIG. 8, the wall surface 53a of the lower vapor flow channel recess 53 and the wall surface 54a of the upper vapor flow channel recess 54 are connected to form the penetration portion 34. The wall surface 53a and the wall surface 54a are each curved toward the penetration portion 34. In this manner, the lower vapor flow channel recess 53 communicates with the upper vapor flow channel recess 54. According to the present embodiment, like the planar shape of the first vapor passage 51, the planar shape of the penetration portion 34 in the first vapor passage 51 is a rectangular frame shape. Like the planar shape of the second vapor passage 52, the planar shape of the penetration portion 34 in the second vapor passage 52 is an elongated rectangle. The wall surface 53a of the lower vapor flow channel recess 53 may merge with the wall surface 54a of the upper vapor flow channel recess 54, and a ridge line may be formed. The ridge line may define the penetration portion 34. As illustrated in FIG. 8, the ridge line may be formed so as to protrude inwardly of the vapor passages 51 and 52. The plane area of the first vapor passage 51 is minimized at the penetration portion 34, and the plane area of the second vapor passage 52 is minimized at the penetration portion 34. A width w2 (refer to FIG. 8) of the penetration portion 34 of the second vapor passage 52 may be, for example, 400 μm to 1600 μm. This also applies to the width of the penetration portion 34 of the first vapor passage 51. Note that the width w2 of the penetration portion 34 corresponds to a gap between two land portions 33 adjacent to each other in the Y direction.

The position of the penetration portion 34 in the Z direction may be the middle position between the first lower sheet surface 10a and the upper sheet surface 20b. Alternatively, the position of the penetration portion 34 may be a position shifted downward or upward from the middle position. The position of the penetration portion 34 in the Z direction is any position as long as the lower vapor flow channel recess 53 communicates with the upper vapor flow channel recess 54. The Z direction corresponds to the up-down direction in FIG. 8.

According to the present embodiment, the sectional shape of each of the first vapor passage 51 and the second vapor passage 52 is formed to include the penetration portion 34 defined by the ridge line formed to protrude inwardly. However, the shape is not limited thereto. For example, the sectional shape of the first vapor passage 51 and the sectional shape of the second vapor passage 52 may be trapezoidal, rectangular, or barrel-shaped.

The first vapor flow channel portion 50 including the first vapor passage 51 and the second vapor passage 52 formed in this manner constitutes part of the above-described sealed space 3. As illustrated in FIG. 3, the first vapor flow channel portion 50 according to the present embodiment is defined mainly by the lower sheet 10, the upper sheet 20, and the frame body portion 32 and the land portion 33 of the sheet body 31 described above. Each of the vapor passages 51 and 52 has a relatively large flow passage cross-sectional area so as to enable the working vapor 2a to pass therethrough.

Note that for clarity of the drawing, the first vapor passage 51, the second vapor passage 52, and the like are enlarged in FIG. 3. The numbers and arrangement of the vapor passages 51 and 52 differ from those in FIGS. 2, 6, and 7.

Note that although not illustrated, a plurality of support portions may be provided in the first vapor flow channel portion 50 to support the land portions 33 by the frame body portion 32. In addition, support portions may be provided to support two land portions 33 adjacent each other. These support portions may be provided on either side of the land portion 33 in the X direction or on either side of the land portion 33 in the Y direction. It is desirable that the support portions be formed so as not to obstruct the flow of working vapor 2a diffusing through the first vapor flow channel portion 50. For example, the support portion may be disposed adjacent to one of the first body surface 31a and the second body surface 31b of the sheet body 31 of the wick sheet 30, and a space constituting a vapor flow channel recess may be formed adjacent to the other thereof. This configuration allows the thickness of the support portion to be less than that of the sheet body 31, and separation of the first vapor passage 51 from the second vapor passages 52 can be prevented in the X and Y directions.

As illustrated in FIGS. 6 and 7, an alignment hole 35 may be provided in each of the four corners of the sheet body 31 of the wick sheet 30.

As illustrated in FIG. 2, the vapor chamber 1 may include an injection portion 4 at one edge thereof in the X direction for injecting the working liquid 2b into the sealed space 3. In the configuration illustrated in FIG. 2, the injection portion 4 is disposed adjacent to the evaporation region SR. The injection portion 4 protrudes outward from the edge adjacent to the evaporation region SR.

More specifically, the injection portion 4 may include a lower injection protrusion 11, an upper injection protrusion 21, and a wick sheet injection protrusion 36. As illustrated in FIG. 4, the lower injection protrusion 11 is part of the lower sheet 10. As illustrated in FIG. 5, the upper injection protrusion 21 is part of the upper sheet 20. As illustrated in FIGS. 6 and 7, the wick sheet injection protrusion 36 is part of the sheet body 31. The wick sheet injection protrusion 36 has an injection flow channel 37 formed therein. The injection flow channel 37 extends from the first body surface 31a to the second body surface 31b of the sheet body 31 and penetrates the sheet body 31 (more specifically, the wick sheet injection protrusion 36) in the Z direction. In addition, the injection flow channel 37 communicates with the first vapor flow channel portion 50. The working liquid 2b is injected into the sealed space 3 through the injection flow channel 37. The injection flow channel 37 may communicate with the liquid flow channel portions 60, depending on the arrangement of the liquid flow channel portions 60. The upper and lower surfaces of the wick sheet injection protrusion 36 are formed in a flat shape. In addition, the upper surface of the lower injection protrusion 11 and the lower surface of the upper injection protrusion 21 are formed in a flat shape. The injection protrusions 11, 21, and 38 may have the same planar shape.

The present embodiment has been described with reference to an example in which the injection portion 4 is provided at one of two edges in the X direction of the vapor chamber 1. However, the position of the injection portion 4 is not limited thereto, and the injection portion 4 can be provided at any position. In addition, the injection flow channel 37 provided in the wick sheet injection protrusion 36 does not necessarily have to penetrate the sheet body 31 as long as the working liquid 2b can be injected. In this case, the injection flow channel 37 that communicates with the first vapor flow channel portion 50 can be formed by a recess formed on one of the first body surface 31a and the second body surface 31b of the sheet body 31.

As illustrated in FIGS. 3, 6 and 8, the liquid flow channel portion 60 is provided on the second body surface 31b of the sheet body 31 of the wick sheet 30. The liquid flow channel portion 60 may be a channel through which the working liquid 2b mainly passes. The liquid flow channel portion 60 constitutes part of the sealed space 3 described above. The liquid flow channel portion 60 communicates with the first vapor flow channel portion 50. The liquid flow channel portion 60 is configured so as to have a capillary structure for delivering the working liquid 2b to the evaporation region SR. The liquid flow channel portion 60 is also referred to as a wick. According to the present embodiment, the liquid flow channel portion 60 is provided on the second body surface 31b of each of the land portions 33 of the wick sheet 30. The liquid flow channel portion 60 may be formed over the entire second body surface 31b of each land portion 33. The liquid flow channel portion 60 need not be provided on the first body surface 31a of each land portion 33.

Figure 9:
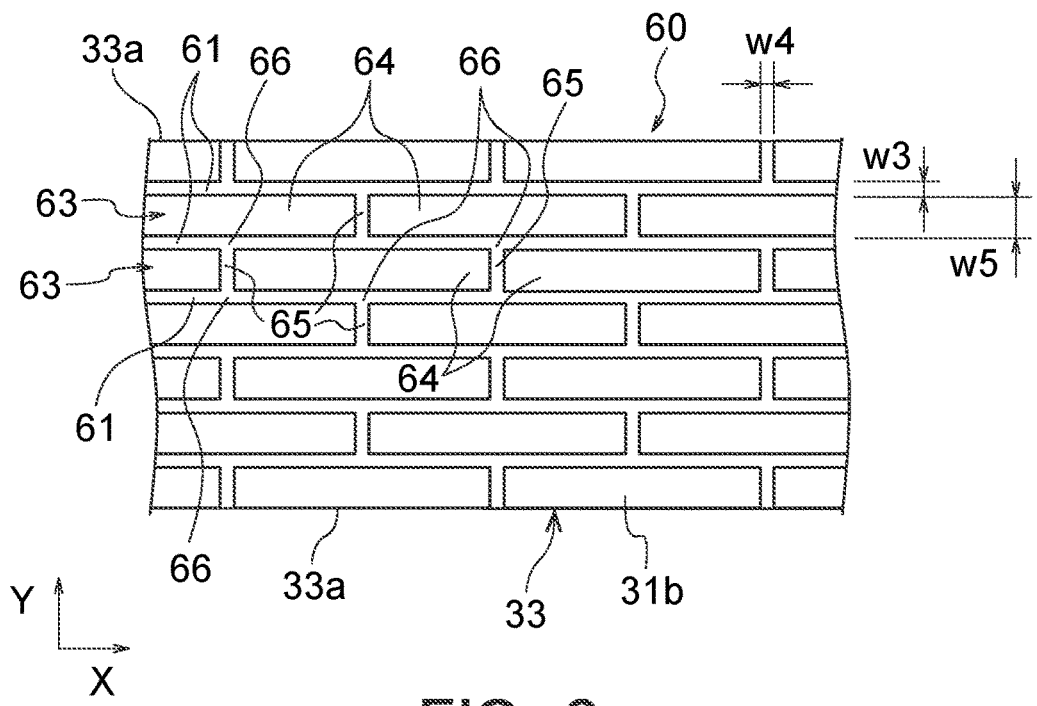
FIG. 9 is a partially enlarged top view of a liquid flow channel portion illustrated in FIG. 6.

As illustrated in FIG. 9, the liquid flow channel portion 60 is an example of a second body surface groove portion. More specifically, the liquid flow channel portion 60 includes a plurality of liquid flow channel mainstream grooves 61 and a plurality of liquid flow channel connection grooves 65. The liquid flow channel mainstream groove 61 is an example of a second groove. The liquid flow channel mainstream groove 61 and the liquid flow channel connection groove 65 are grooves through which the working liquid 2b passes. The liquid flow channel connection groove 65 communicates with the liquid flow channel mainstream groove 61.

As illustrated in FIG. 9, each of the liquid flow channel mainstream grooves 61 extends in the X direction. The liquid flow channel mainstream groove 61 has such a flow passage cross-sectional area that the working liquid 2b flows mainly by capillary action. The flow passage cross-sectional area of the liquid flow channel mainstream groove 61 is less than that of each of the vapor passages 51 and 52. In this manner, the liquid flow channel mainstream groove 61 is configured to deliver, to the evaporation region SR, the working liquid 2b condensed from the working vapor 2a. The liquid flow channel mainstream grooves 61 may be spaced equally apart in the Y direction that is orthogonal to the X direction.

The liquid flow channel mainstream grooves 61 are formed by etching the second body surface 31b of the sheet body 31 of the wick sheet 30 in an etching process (described below). In this way, each of the liquid flow channel mainstream grooves 61 has a curved wall surface 62, as illustrated in FIG. 8. The wall surface 62 defines the liquid flow channel mainstream groove 61 and is curved so as to expand toward the first body surface 31a.

As illustrated in FIGS. 8 and 9, a width w3 of the liquid flow channel mainstream groove 61 may be, for example, 5 μm to 150 μm. The width w3 of the liquid flow channel mainstream groove 61 refers to the dimension of the liquid flow channel mainstream groove 61 at the second body surface 31b. The width w3 corresponds to the dimension in the Y direction. In addition, as illustrated in FIG. 8, a depth h1 of the liquid flow channel mainstream groove 61 may be, for example, 3 μm to 150 μm. The depth h1 corresponds to the dimension in the Z direction.

As illustrated in FIG. 9, each of the liquid flow channel connection grooves 65 extends in a direction that differs from the X direction. According to the present embodiment, each of the liquid flow channel connection grooves 65 extends in the Y direction. The liquid flow channel connection grooves 65 are formed orthogonal to the liquid flow channel mainstream grooves 61. Some of the liquid flow channel connection grooves 65 allow two neighboring liquid flow channel mainstream grooves 61 to communicate with each other. The other liquid flow channel connection grooves 65 allow the first vapor passage 51 or the second vapor passages 52 to communicate with the liquid flow channel mainstream groove 61. That is, the liquid flow channel connection groove 65 extends from a side edge 33a in the Y direction of the land portion 33 to the liquid flow channel mainstream groove 61 adjacent to the side edge 33a. In this way, the first vapor passage 51 is enabled to communicate with the liquid flow channel mainstream groove 61, and the second vapor passage 52 is enabled to communicate with the liquid flow channel mainstream groove 61.

The liquid flow channel connection groove 65 has such a flow passage cross-sectional area that the working liquid 2b flows mainly by the capillary action. The flow passage cross-sectional area of the liquid flow channel connection groove 65 is less than that of each of the vapor passages 51 and 52. The liquid flow channel connection grooves 65 may be disposed so as to be spaced equally apart in the X direction.

Like the liquid flow channel mainstream grooves 61, the liquid flow channel connection grooves 65 are formed through an etching process. Each of the liquid flow channel connection grooves 65 has a curved wall (not illustrated) similar to that of the liquid flow channel mainstream groove 61. As illustrated in FIG. 9, a width w4 of the liquid flow channel connection groove 65 may be the same as the width w3 of the liquid flow channel mainstream groove 61. However, the width w4 may be greater or less than the width w3. The width w4 corresponds to the dimension in the X direction. The depth of the liquid flow channel connection groove 65 may be the same as the depth h1 of the liquid flow channel mainstream groove 61. However, the depth of the liquid flow channel connection groove 65 may be greater or less than the depth h1.

As illustrated in FIG. 9, the liquid flow channel portion 60 includes convex portion rows 63 provided on the second body surface 31b of the sheet body 31. The convex portion row 63 is provided between two neighboring liquid flow channel mainstream grooves 61. Each of the convex portion rows 63 includes a plurality of convex portions 64 arranged in the X direction. The convex portion 64 is an example of a liquid flow channel protrusion portion. The convex portions 64 are provided in the liquid flow channel portion 60. The convex portions 64 protrude from the sheet body 31 and are in contact with the upper sheet 20. Each of the convex portions 64 is formed in a rectangular shape in plan view such that the X direction is the longitudinal direction thereof. Each of the liquid flow channel mainstream grooves 61 is disposed between two neighboring convex portions 64 in the Y direction. Each of the liquid flow channel connection grooves 65 is disposed between two neighboring convex portions 64 in the X direction. The liquid flow channel connection groove 65 extends in the Y direction and enables two neighboring liquid flow channel mainstream grooves 61 in the Y direction to communicate with each other. This configuration allows the working liquid 2b to flow back and forth between the liquid flow channel mainstream grooves 61.

The convex portion 64 is a portion where the material of the wick sheet 30 remains without being etched in the etching process (described below). According to the present embodiment, the planar shape of the convex portion 64 is rectangular, as illustrated in FIG. 9. The planar shape of the convex portion 64 corresponds to the planar shape of the sheet body 31 at the location of the second body surface 31b.

According to the present embodiment, the convex portions 64 are arranged in a staggered pattern. More specifically, the convex portions 64 of two neighboring convex portion rows 63 in the Y direction are displaced from each other in the X direction. The amount of displacement may be half the arrangement pitch of the convex portions 64 in the X direction. A width w5 of the convex portion 64 may be, for example, 5 μm to 500 μm. The width w5 of the convex portion 64 refers to the dimension in the Y direction at the second body surface 31b. The arrangement of the convex portions 64 is not limited to a staggered pattern but may be arranged in parallel. In this case, the convex portions 64 of the neighboring convex portion rows 63 in the Y direction are also aligned in the X direction (refer to FIG. 19).

The liquid flow channel mainstream groove 61 includes a liquid flow channel intersection portion 66. The liquid flow channel intersection portion 66 is a portion of the liquid flow channel mainstream groove 61 in which the liquid flow channel intersection portion 66 communicates with the liquid flow channel connection groove 65. In the liquid flow channel intersection portion 66, the liquid flow channel mainstream groove 61 and the liquid flow channel connection groove 65 communicate with each other in a T-shape. This prevents that in the liquid flow channel intersection portion 66 in which one liquid flow channel mainstream groove 61 communicates with the liquid flow channel connection groove 65 located on one side, the liquid flow channel connection groove 65 located on the other side communicates with the liquid flow channel mainstream groove 61. For example, it can be prevented that in one liquid flow channel intersection portions 66, the upper liquid flow channel connection groove 65 and the lower liquid flow channel connection groove 65 in FIG. 9 communicate with each other. That is, when the liquid flow channel connection grooves 65 located on either side of the liquid flow channel mainstream groove 61 in the Y direction are disposed at the same position in the X direction, the liquid flow channel mainstream groove 61 and the liquid flow channel connection groove 65 intersect each other in a crisscross shape. In this case, part of the wall surface 62 (refer to FIG. 8) of the liquid flow channel mainstream groove 61 is cut out on both sides by the liquid flow channel connection grooves 65 located at the same position in the X direction. At the cut-out portion, a crisscross continuous space is formed, and the capillary action of the liquid flow channel mainstream groove 61 may be reduced. In contrast, according to the present embodiment, the liquid flow channel connection grooves 65 on either side of the one liquid flow channel mainstream groove 61 in the Y direction are located at different positions in the X direction. As a result, the position at which the wall surface 62 of the liquid flow channel mainstream groove 61 is cut out by the liquid flow channel connection groove 65 on one side in the Y direction can be made different from that on the other side in the Y direction, in the X direction. In this case, since the liquid flow channel mainstream groove 61 communicates with the liquid flow channel connection groove 65 on one side in the Y direction, the wall surface 62 of the liquid flow channel mainstream groove 61 on the other side in the Y direction can still remain. Accordingly, at the position at which the wall surface 62 of the liquid flow channel mainstream groove 61 is cut out by the liquid flow channel connection groove 65, a continuous space is formed in a T shape and, thus, a decrease in capillary action of the liquid flow channel mainstream groove 61 can be reduced. In this manner, a decrease in the propulsive force of the working liquid 2b towards the evaporation region SR can be reduced in the liquid flow channel intersection portion 66.

As illustrated in FIGS. 3, 7 and 8, the second vapor flow channel portions 70 are provided on the first body surface 31a of the land portion 33 of the wick sheet 30. Each of the second vapor flow channel portions 70 may be a portion through which the working vapor 2a mainly flows. The second vapor flow channel portion 70 constitutes part of the sealed space 3 described above. The second vapor flow channel portion 70 communicates with the first vapor flow channel portion 50 and further communicates with the liquid flow channel portion 60 via the first vapor flow channel portion 50. According to the present embodiment, the second vapor flow channel portions 70 are provided on the first body surface 31a of each of the land portions 33 of the wick sheet 30.

As illustrated in FIG. 7, the second vapor flow channel portion 70 according to the present embodiment may be disposed on one side of the land portion 33 in the X-direction. The second vapor flow channel portion 70 may be formed on the one side of the center of the land portion 33 in the X direction. The second vapor flow channel portion 70 according to the present embodiment may be disposed in the evaporation region SR. However, the location of the second vapor flow channel portion 70 is not limited thereto. The second vapor flow channel portion 70 may partially protrude outward from the evaporation region SR. When at least part of the second vapor flow channel portion 70 is disposed in the evaporation region SR, the working vapor 2a that is evaporated from the working liquid 2b by receiving heat from the electronic device D in the evaporation region SR easily diffuses in the Y direction.

Figure 10:
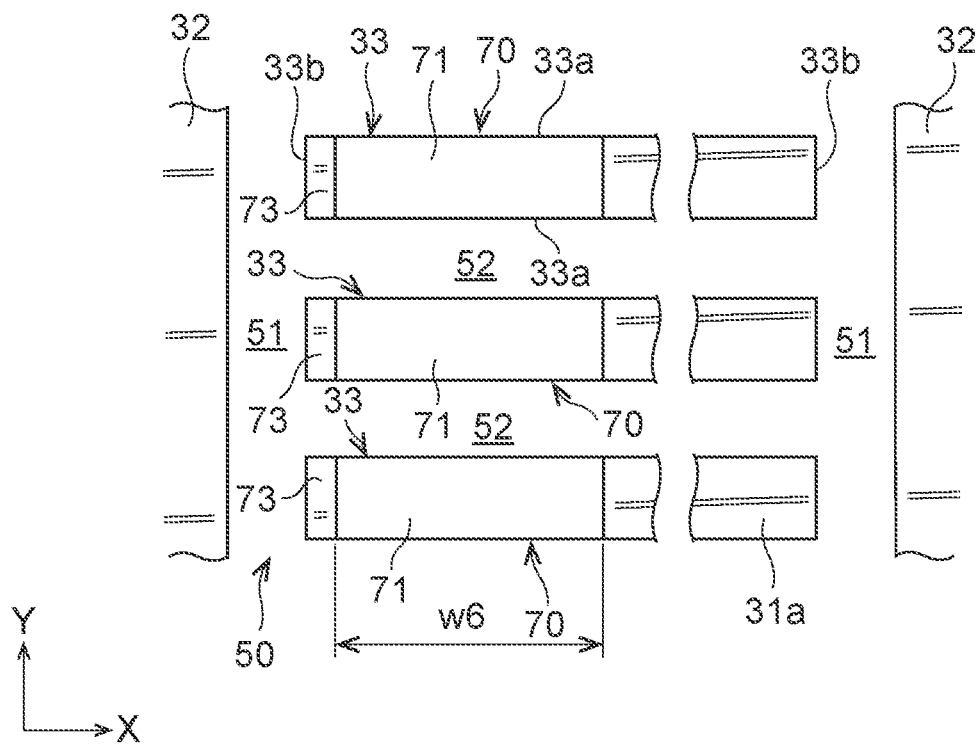
FIG. 10 is a partially enlarged bottom view of a second vapor flow channel portion illustrated in FIG. 7.

As illustrated in FIG. 10, the second vapor flow channel portion 70 is an example of a first body surface groove portion. More specifically, the second vapor flow channel portion 70 includes a vapor flow channel groove 71. The vapor flow channel groove 71 is an example of a first groove. The vapor flow channel groove 71 extends from one side edge 33a to the other side edge 33a of the land portion 33 in the Y direction orthogonal to the X direction. According to the present embodiment, each of the land portions 33 has the vapor flow channel groove 71 formed therein. The vapor flow channel groove 71 extends in the Y direction orthogonal to the second vapor passage 52. FIG. 10 illustrates an example in which the dimension of the vapor flow channel groove 71 in the Y direction is less than the dimension of the vapor flow channel groove 71 in the X direction. However, the dimensions are not limited thereto. The side edge 33a of the land portion 33 means the edge of the land portion 33 in the Y direction and is used as a term indicating the position of the wall surface 53a of the lower vapor flow channel recess 53 at the first body surface 31a.

The land portion 33 includes a pair of end edges 33b. The end edges 33b are the end edges of the land portion 33 in the X direction. As illustrated in FIG. 10, an end edge convex portion 73 is formed between the vapor flow channel groove 71 and the end edge 33b on one side. The end edge convex portion 73 is in contact with the lower sheet 10. More specifically, the end edge convex portion 73 is formed between the end edge 33b disposed in the evaporation region SR and the vapor flow channel groove 71 in the X direction. The end edge convex portion 73 is formed on one side of the second vapor flow channel portion 70 in the X direction and constitutes the first body surface 31a. Accordingly, the end edge convex portion 73 is in contact with the lower sheet 10 and is bonded to the lower sheet 10. The first body surface 31a still remains on the other side of the vapor flow channel groove 71. Each of the end edges 33b of the land portion 33 means the edge of the land portion 33 in the X direction and is used as a term indicating the position of the wall surface 53a of the lower vapor flow channel recess 53 at the first body surface 31a.

The flow passage cross-sectional area of the vapor flow channel groove 71 of the second vapor flow channel portion 70 is less than that of each of the vapor passages 51 and 52. However, the flow passage cross-sectional area of the vapor flow channel groove 71 may be greater than that of the liquid flow channel mainstream groove 61 of the liquid flow channel portion 60 described above. In this manner, the capillary force acting on the working liquid 2b in the vapor flow channel groove 71 may be smaller than the capillary force acting on the working liquid 2b in the liquid flow channel mainstream groove 61.

Figure 11A:
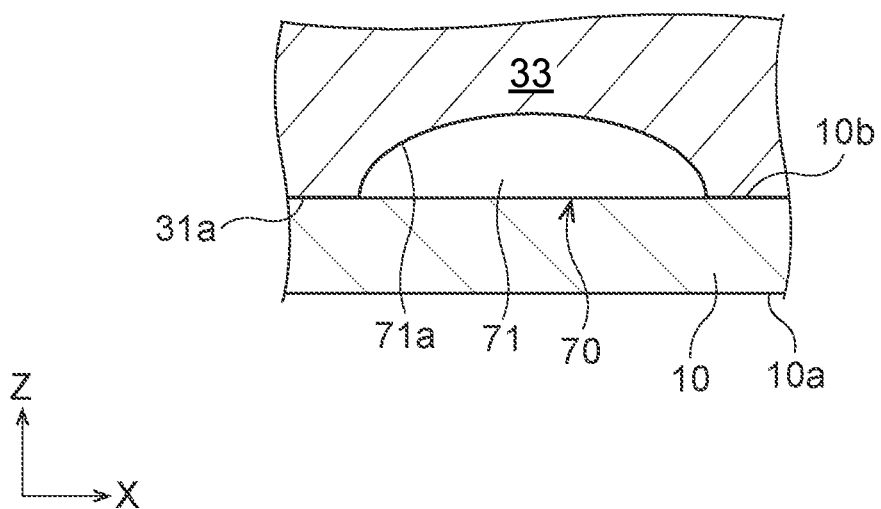
FIG. 11A depicts a partial section taken along line B-B of FIG. 7 together with the lower sheet.

The vapor flow channel groove 71 is formed by etching the first body surface 31a of the sheet body 31 of the wick sheet 30 in an etching process (described below). In this manner, as illustrated in FIG. 11A, the vapor flow channel groove 71 has a curved wall surface 71a. The wall surface 71a defines the vapor flow channel groove 71 and is curved so as to expand toward the second body surface 31b. As described above, in the section in FIG. 11A, an example is illustrated in which the wall surface 71a is curved so as to form part of an ellipse. When the wall surface 71a is formed in this way, the force applied from above, for example, can be distributed in the X direction and, thus, the vapor flow channel groove 71 can be inhibited from being crashed. In addition, the space at the center of the vapor flow channel groove in the X direction can be relatively increased. This configuration can decrease the resistance to the flow of the working vapor 2a and, thus, reduce the pressure loss of the working vapor 2a flowing in the vapor flow channel groove 71.

However, the shape of the wall surface 71a of the vapor flow channel groove 71 is not limited to the shape illustrated in FIG. 11A.

Figure 11B:
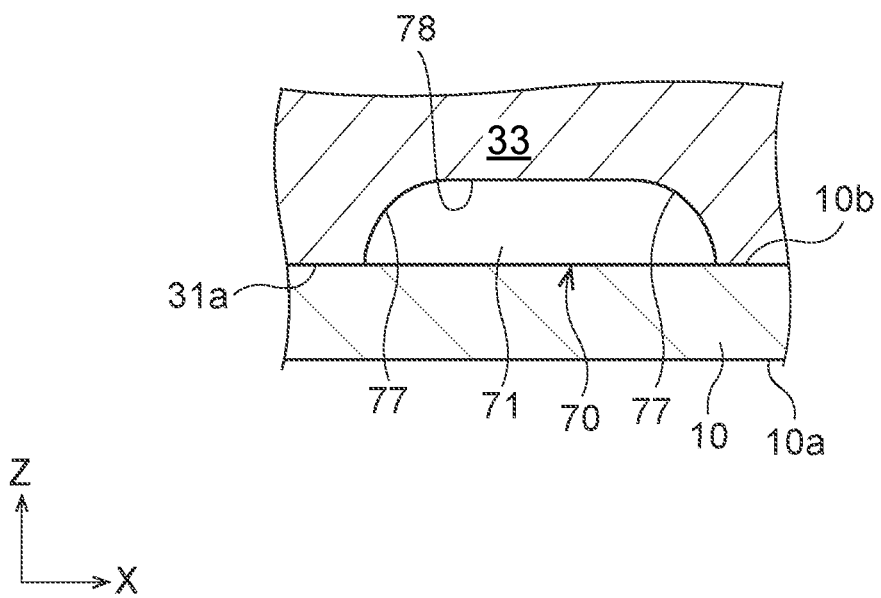
FIG. 11B is a partial sectional view illustrating a modification of FIG. 11A.

For example, as illustrated in FIG. 11B, the vapor flow channel groove 71 may have two curved wall surfaces 77 and a linear wall surface 78. The curved wall surfaces 77 are curved. The linear wall surface 78 is provided between the two curved wall surfaces 77 and is formed to have a linear shape. In FIG. 11B, each of the curved wall surfaces 77 is curved so as to form part of a circular arc. However, the shape is not limited thereto. When the vapor flow channel groove 71 is formed in this manner, the occurrence of capillary action on the linear wall surface 78 can be inhibited and, thus, the working liquid 2b is inhibited from flowing into the vapor flow channel groove 71. In addition, in a portion of the vapor flow channel groove 71 defined by the linear wall surface 78, the resistance to the flow of the working vapor 2a can be reduced and, thus, pressure loss of the working vapor 2a flowing in the vapor flow channel groove 71 can be reduced.

Figure 11C:
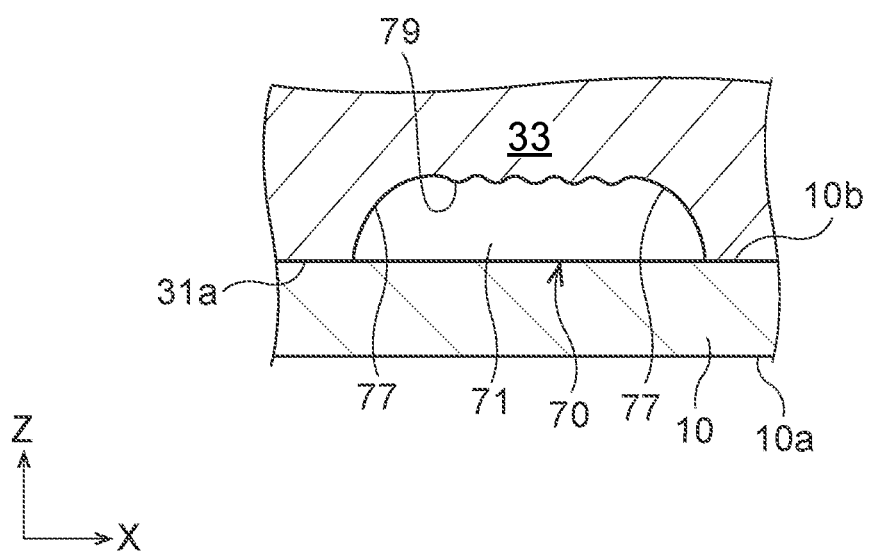
FIG. 11C is a partial sectional view illustrating another modification of FIG. 11A.

For example, as illustrated in FIG. 11C, the vapor flow channel groove 71 may have two curved wall surfaces 77 and an irregular wall surface 79. The curved wall surfaces 77 are curved. The irregular wall surface 79 is provided between the two curved wall surfaces 77 and is formed to have irregularities. The flow of the working vapor 2a can be led by the irregularities of the irregular wall surface 79. In this case, the resistance to the flow of the working vapor 2a can be reduced and, thus, pressure loss of the working vapor 2a flowing in the vapor flow channel groove 71 can be reduced. The height of irregularities formed on the irregular wall surface 79 may be less than a height h2 of the vapor flow channel groove 71 (described below). In addition, the planar shape of the irregularities may be any shape. The linear wall surface 78 illustrated in FIG. 11B may be formed as part of the irregular wall surface 79.

As illustrated in FIGS. 7 and 10, the second vapor flow channel portion 70 described above is formed on the first body surface 31a of each of the land portions 33. The vapor flow channel groove 71 of one of two land portions 33 adjacent to each other in the Y direction and the vapor flow channel groove 71 of the other land portion 33 are disposed at different positions as viewed in the Y direction. That is, the vapor flow channel grooves 71 of the land portions 33 adjacent to each other are continuously formed via the second vapor passage 52 and are formed on the extension lines of each other. The vapor flow channel grooves 71 of the land portions 33 adjacent to each other may be disposed at the same position in the X direction. However, the positions of the vapor flow channel grooves 71 are not limited thereto. For example, the vapor flow channel groove 71 of one of two land portions 33 adjacent to each other in the Y direction and the vapor flow channel groove 71 of the other land portion 33 are disposed at positions different from the positions at which the vapor flow channel grooves 71 overlap as viewed in the Y direction. In this case, the vapor flow channel grooves 71 are disposed at positions at which they do not overlap as viewed in the Y direction, and the positions are different in the X direction.

As illustrated in FIG. 10, a width w6 of the vapor flow channel groove 71 may be greater than a width w3 (refer to FIG. 9) of the liquid flow channel mainstream groove 61 described above. The width w6 may be, for example, 500 μm to 30000 μm. Note that the width w6 of the vapor flow channel groove 71 refers to the dimension at the first body surface 31a. The width w6 corresponds to the dimension in the X direction. In addition, as illustrated in FIG. 8, the depth h2 of the vapor flow channel groove 71 may be greater than the depth h1 of the liquid flow channel mainstream groove 61 described above. The depth h2 may be, for example, 25 μm to 200 μm. The depth h2 corresponds to the dimension in the Z direction.

The end edge convex portion 73 is a portion where the material of the wick sheet 30 remains without being etched in the etching process (described below). According to the present embodiment, the planar shape of the end edge convex portion 73 is rectangular, as illustrated in FIG. 10. The planar shape of the end edge convex portion 73 corresponds to the planar shape of the sheet body 31 at the position of the first body surface 31a of the sheet body 31.

Note that the materials of the lower sheet 10, the upper sheet 20, and the wick sheet 30 are not limited to particular materials as long as the materials have excellent thermal conductivity. The lower sheet 10, the upper sheet 20, and the wick sheet 30 may contain copper or a copper alloy, for example. In this case, the thermal conductivity of each of the sheets 10, 20, and 30 can be increased, and the heat dissipation efficiency of the vapor chamber 1 can be increased. In addition, if pure water is used as the working fluids 2a and 2b, the occurrence of corrosion can be prevented. Other metal materials, such as aluminum and titanium, or other metal alloy materials, such as stainless steel, can be used for the sheets 10, 20, and 30, as long as a desired heat dissipation efficiency can be obtained and as long as the occurrence of corrosion can be prevented.

A thickness t1 of the vapor chamber 1 illustrated in FIG. 3 may be, for example, 100 μm to 1000 μm. By setting the thickness t1 of the vapor chamber 1 to 100 μm or greater, the first vapor flow channel portion 50 can be properly provided. Thus, the function of the vapor chamber 1 can be properly performed. In addition, by setting the thickness t1 to 1000 μm or less, the thickness t1 of the vapor chamber 1 can be inhibited from increasing.

A thickness t2 of the lower sheet 10 may be, for example, 6 μm to 100 μm. By setting the thickness t2 of the lower sheet 10 to 6 μm or greater, the mechanical strength of the lower sheet 10 can be ensured. In addition, by setting the thickness t2 of the lower sheet 10 to 100 μm or less, the thickness t1 of the vapor chamber 1 can be inhibited from increasing. Similarly, a thickness t3 of the upper sheet 20 may be set in the same way as the thickness t2 of the lower sheet 10. The thickness t3 of the upper sheet 20 may differ from the thickness t2 of the lower sheet 10.

A thickness t4 of the wick sheet 30 may be, for example, 50 μm to 400 μm. By setting the thickness t4 of the wick sheet 30 to 50 μm or greater, the first vapor flow channel portion 50 can be properly provided. Therefore, the function of vapor chamber 1 can be properly performed. In addition, by setting the thickness t4 to 400 μm or less, the thickness t1 of the vapor chamber 1 can be inhibited from increasing.

Figure 12:
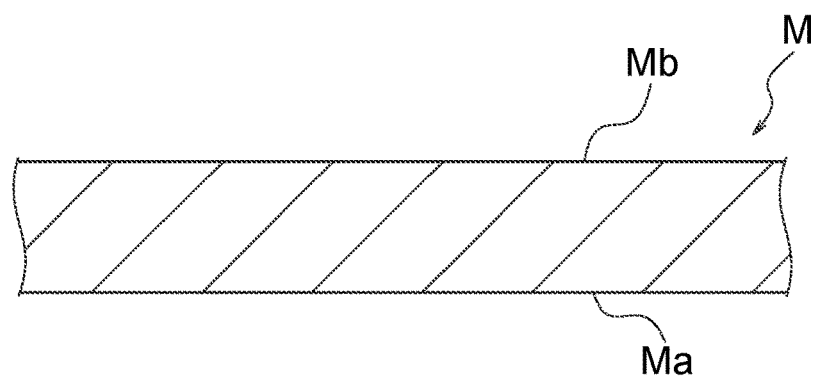
FIG. 12 is a diagram illustrating a wick sheet preparation process of a method for manufacturing the vapor chamber according to an embodiment.
Figure 13:
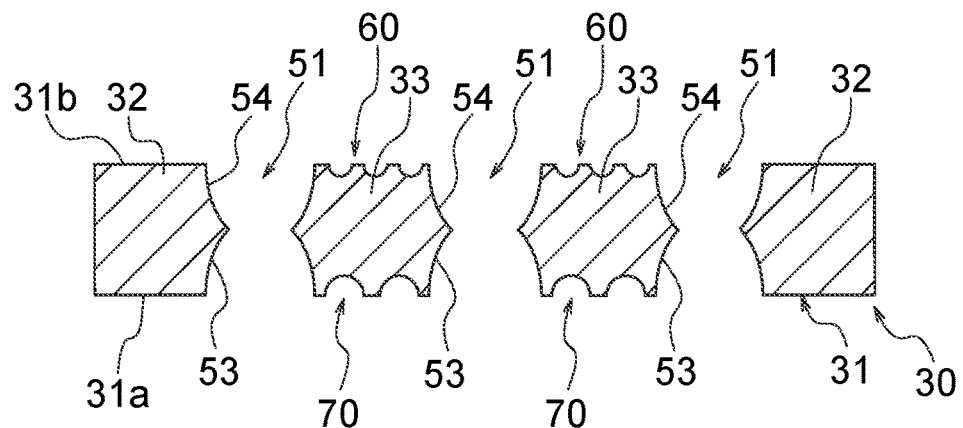
FIG. 13 is a diagram illustrating an etching process of the method for manufacturing the vapor chamber according to the embodiment.
Figure 14:
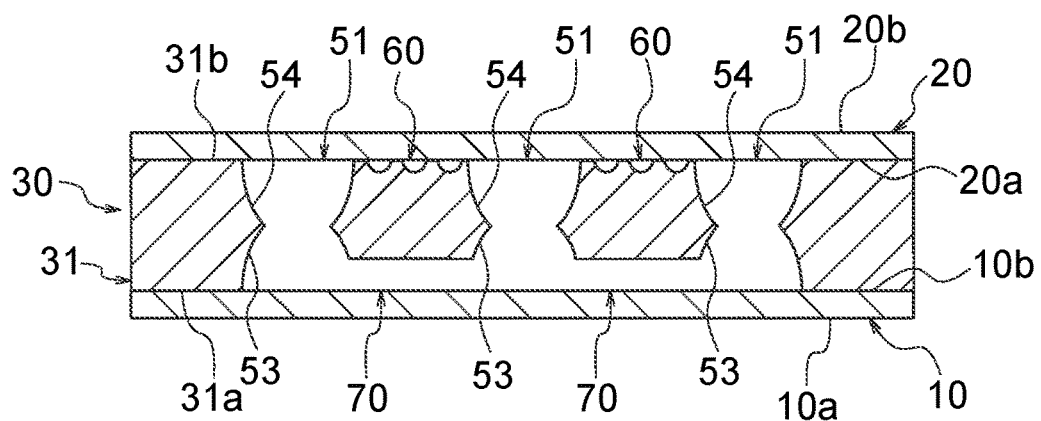
FIG. 14 is a diagram illustrating a joining process of the method for manufacturing the vapor chamber according to the embodiment.

A method for manufacturing the vapor chamber 1 having the above-described configuration according to the present embodiment is described below with reference to FIGS. 12 to 14. FIGS. 12 to 14 illustrate sectional views similar to the sectional view in FIG. 3.

The process of producing the wick sheet 30 is described first.

As illustrated in FIG. 12, a flat metal sheet M is prepared in a preparatory process first. The metal sheet M has a first material surface Ma and a second material surface Mb. The metal sheet M may be made of a rolled material having a desired thickness.

After the preparation process, an etching process is performed. In the etching process, the metal sheet M is etched from each of the first material surface Ma and the second material surface Mb, as illustrated in FIG. 13. In this manner, the first vapor flow channel portion 50, the liquid flow channel portion 60, and the second vapor flow channel portion 70 are formed in the metal sheet M.

More specifically, a patterned resist film (not illustrated) is formed on each of the first material surface Ma and the second material surface Mb of the metal sheet M by photolithography technique. Subsequently, the first material surface Ma and the second material surface Mb of the metal sheet M are etched through the openings of the patterned resist film. In this manner, the first material surface Ma and the second material surface Mb of the metal sheet M are etched according to the pattern to form the first vapor flow channel portion 50, the liquid flow channel portion 60, and the second vapor flow channel portion 70 illustrated in FIG. 13. For example, ferric chloride etchant, such as aqueous ferric chloride, or copper chloride etchant, such as copper chloride aqueous solution, can be used as the etchant.

Etching may be carried out on the first material surface Ma and the second material surface Mb of the metal sheet M at the same time. However, the etching process is not limited thereto. Etching of the first material surface Ma and the second material surface Mb may be carried out as separate processes. In addition, the first vapor flow channel portion 50, the liquid flow channel portion 60, and the second vapor flow channel portion 70 may be formed by etching at the same time or in separate processes.

In the etching process, the first material surface Ma and the second material surface Mb of the metal sheet M are etched to obtain the predetermined outline contour shape illustrated in FIGS. 6 and 7.

In this way, the wick sheet 30 according to the present embodiment is obtained.

In a joining process carried out after the process of producing the wick sheet 30, the lower sheet 10, the upper sheet 20, and the wick sheet 30 are joined together, as illustrated in FIG. 14. The lower sheet 10 and the upper sheet 20 may be made of a rolled material having a desired planar shape and a desired thickness.

More specifically, the lower sheet 10, the wick sheet 30, and the upper sheet 20 are stacked in this order first. In this case, the first body surface 31a of the wick sheet 30 is stacked on the second lower sheet surface 10b of the lower sheet 10, and the first upper sheet surface 20a of the upper sheet 20 is stacked on the second body surface 31b of the wick sheet 30. At this time, the alignment holes 12 of the lower sheet 10, alignment holes 35 of the wick sheet 30, and alignment holes 22 of the upper sheet 20 are used to align the sheets 10, 20, and 30.

Subsequently, the lower sheet 10, wick sheet 30, and upper sheet 20 are temporarily bonded together. For example, spot resistance welding may be used to temporarily bond the sheets 10, 20, and 30 together. Alternatively, laser welding may be used to temporarily bond the sheets 10, 20, and 30 together.

Subsequently, the lower sheet 10, the wick sheet 30, and the upper sheet 20 are permanently bonded by diffusion bonding. Diffusion bonding is a technique of bonding using the diffusion of atoms that occurs on the bonding surfaces when the lower sheet 10, the wick sheet 30, and the upper sheet 20 are pressurized in the stacking direction and are heated in a controlled atmosphere, such as vacuum or inert gas. During pressurization, the lower sheet 10 is in tight contact with the wick sheet 30, and the wick sheet 30 is in tight contact with the upper sheet 20. In diffusion bonding, the materials of the sheets 10, 20, and 30 are heated to a temperature close to, but lower than, the melting point, thus avoiding melting and deformation of the sheets 10, 20, and 30. More specifically, the first body surface 31a of each of the frame body portion 32 and the land portions 33 of the wick sheet 30 is diffusion bonded to the second lower sheet surface 10b of the lower sheet 10. In addition, the second body surface 31b of each of the frame body portion 32 and the land portions 33 of the wick sheet 30 is diffusion bonded to the first upper sheet surface 20a of the upper sheet 20. In this way, the sheets 10, 20, and 30 are diffusion bonded together to form the sealed space 3 having the first vapor flow channel portion 50, the liquid flow channel portion 60, and the second vapor flow channel portion 70 between the lower sheet 10 and the upper sheet 20. In this stage, the above-described injection flow channel 37 is not sealed. In the above-described injection portion 4, the lower injection protrusion 11 of the lower sheet 10 and the wick sheet injection protrusion 36 of the wick sheet 30 are diffusion bonded together. In addition, the wick sheet injection protrusion 36 and the upper injection protrusion 21 of the upper sheet 20 are diffusion bonded together.

After the joining process, the working liquid 2b is injected into the sealed space 3 through the injection portion 4. At this time, the volume of the injected working liquid 2b may be greater than the total volume of a space formed by the liquid flow channel mainstream grooves 61 and the liquid flow channel connection grooves 65 of the liquid flow channel portion 60.

Subsequently, the injection flow channel 37 described above is sealed. For example, a laser beam may be emitted to the injection portion 4 to partially melt the injection portion 4 and seal the injection flow channel 37. In this manner, communication of the sealed space 3 with the outside is blocked, achieving a sealed space 3 that is filled with the working liquid 2b. Thus, leakage of the working liquid 2b in the sealed space 3 to the outside is prevented. To seal the injection flow channel 37, the injection portion 4 may be caulked (or pressed and plastically deformed) or brazed.

As described above, the vapor chamber 1 according to the present embodiment is obtained.

A method for operating the vapor chamber 1, that is, a method for cooling the electronic device D is described below.

The vapor chamber 1 obtained as described above is mounted in the housing H of a mobile terminal or the like. An electronic device D (e.g., a CPU), which is a device to be cooled, is mounted on the second upper sheet surface 20b of the upper sheet 20. The working liquid 2b in the sealed space 3 adheres to the wall surface of the sealed space 3 due to its surface tension. More specifically, the working liquid 2b adheres to the wall surface 53a of the lower vapor flow channel recess 53, the wall surface 54a of the upper vapor flow channel recess 54, the wall surface 62 of the liquid flow channel mainstream groove 61, a wall surface of the liquid flow channel connection groove 65 of the liquid flow channel portion 60, and the wall surface 71a of the vapor flow channel groove 71 of the second vapor flow channel portion 70. In addition, the working liquid 2b can further adhere to portions of the second lower sheet surface 10b of the lower sheet 10 that are exposed to the lower vapor flow channel recess 53 and the vapor flow channel groove 71. Still furthermore, the working liquid 2b can adhere to portions of the first upper sheet surface 20a of the upper sheet 20 that are exposed to the upper vapor flow channel recess 54, the liquid flow channel mainstream grooves 61, and the liquid flow channel connection grooves 65.

At this time, if the electronic device D generates heat, the working liquid 2b located inside of the evaporation region SR (refer to FIGS. 6 and 7) receives the heat from the electronic device D. The received heat is absorbed in the form of latent heat, and the working liquid 2b evaporates and produce the working vapor 2a. Most of the generated working vapor 2a diffuses in the lower vapor flow channel recesses 53 and upper vapor flow channel recesses 54, which constitute the sealed space 3 (refer to solid arrows in FIG. 6).

More specifically, the working vapor 2a diffuses mainly in the X direction in a portion of the first vapor passage 51 of the first vapor flow channel portion 50 that extends in the X direction and in the second vapor passage 52. In contrast, the working vapor 2a diffuses mainly in the Y direction in a portion of the first vapor passage 51 that extends in the Y direction. In addition, according to the present embodiment, the second vapor flow channel portion 70 is provided on the first body surface 31a of the land portion 33. The second vapor flow channel portion 70 includes the vapor flow channel groove 71 that extends from the side edge 33a on one side of the land portion 33 to the side edge 33a on the other side in the Y direction. Accordingly, the working vapor 2a diffuses mainly in the Y direction even in the vapor flow channel groove 71 of the second vapor flow channel portion 70.

Thereafter, the working vapor 2a in each of the lower vapor flow channel recesses 53 and 54 moves away from the evaporation region SR. Most of the working vapor 2a is delivered to the condensation region CR where the temperature is relatively low. In FIGS. 6 and 7, most of the working vapor 2a is delivered to the right portion of the vapor flow channel portion 50. In the condensation region CR, the working vapor 2a dissipates heat mainly to the lower sheet 10 and is cooled. The heat received by the lower sheet 10 from the working vapor 2a is transferred to the outside air via the housing member Ha (refer to FIG. 3).

The working vapor 2a dissipates the heat to the lower sheet 10 in the condensation region CR. As a result, the working vapor 2a loses the latent heat absorbed in the evaporation region SR and condenses and, thus, the working liquid 2b is generated. The generated working liquid 2b adheres to the wall surface 53a of the lower vapor flow channel recess 53, the wall surface 54a of the vapor flow channel recess 54, the second lower sheet surface 10b of the lower sheet 10, and the first upper sheet surface 20a of the upper sheet 20. At this time, the working liquid 2b continues to evaporate in the evaporation region SR. Accordingly, the working liquid 2b in a region of the liquid flow channel portion 60 other than the evaporation region SR (i.e., the working liquid 2b in the condensation region CR) is delivered toward the evaporation region SR by the capillary action in each of the liquid flow channel mainstream grooves 61 (refer to dashed arrows in FIG. 6). As a result, the working liquid 2b that adhered to each of the wall surfaces 53a and 54a, the second lower sheet surface 10b, and the first upper sheet surface 20a moves to the liquid flow channel portion 60. At this time, the working liquid 2b passes through the liquid flow channel connection grooves 65 and enters the liquid flow channel mainstream grooves 61. In this way, the liquid flow channel mainstream grooves 61 and the liquid flow channel connection grooves 65 are filled with the working liquid 2b. Accordingly, the loaded working liquid 2b is propelled toward the evaporation region SR by capillary action of each of the liquid flow channel mainstream grooves 61. In this way, the working liquid 2b is smoothly delivered toward the evaporation region SR.

In the liquid flow channel portion 60, each of the liquid flow channel mainstream grooves 61 communicates with another neighboring liquid flow channel mainstream groove 61, via the liquid flow channel connection groove 65 adjacent to the liquid flow channel mainstream grove 61. This inhibits the working liquid 2b flowing back and forth between two neighboring liquid flow channel mainstream grooves 61 and dry-out occurring in the liquid flow channel mainstream grooves 61. As a result, capillary action of the working liquid 2b occurs in each of the liquid flow channel mainstream grooves 61 and, thus, the working liquid 2b is smoothly delivered toward the evaporation region SR.

The working liquid 2b that has reached the evaporation region SR through the liquid flow channel portion 60 receives heat from the electronic device D again and evaporates. The working vapor 2a that evaporated from the working liquid 2b moves through the liquid flow channel connection groove 65 in the evaporation region SR to the lower vapor flow channel recess 53 and the upper vapor flow channel recess 54 each having a large flow passage cross-sectional area. Thereafter, the working vapor 2a diffuses in each of the vapor flow channel recesses 53 and 54. Part of the working vapor 2a in the vapor flow channel recesses 53 and 54 passes through the second vapor flow channel portion 70 and diffuses in the Y direction, as described above. In this way, the working fluids 2a and 2b reflux in the sealed space 3 while repeating the phase change, that is, evaporation and condensation. Thus, the heat of the electronic device D is delivered and dissipated. As a result, the electronic device D is cooled.

As described above, according to the present embodiment, the second vapor flow channel portion 70 through which the working vapor 2a passes is provided on the first body surface 31a of the land portion 33. The second vapor flow channel portion 70 includes the vapor flow channel groove 71 that extends from the side edge 33a on one side of the land portion 33 to the side edge 33a on the other side in the Y direction. Thus, the working vapor 2a evaporated in the evaporation region SR can be diffused not only in the X direction in the first vapor passage 51 and the second vapor passage 52 of the first vapor flow channel portion 50 but also in the Y direction through the vapor flow channel groove 71. In this manner, the heat of the electronic device D can be dissipated more, and the heat dissipation efficiency of the vapor chamber 1 can be improved. In this case, the cooling efficiency of the electronic device D can be improved.

According to the present embodiment, the vapor flow channel groove 71 of one of two land portions 33 adjacent to each other in the Y direction and the vapor flow channel groove 71 of the other land portion 33 are disposed at positions at which the vapor flow channel grooves 71 overlap as viewed in the Y direction. Thus, the vapor flow channel groove 71 provided in the land portion 33 can be aligned in the Y direction with the vapor flow channel groove 71 provided on another land portion 33 adjacent to the land portion 33. In this way, the working vapor 2a can be diffused in the Y direction so as to get across the land portions 33 through the vapor flow channel grooves 71 provided in the land portions 33. As a result, the heat dissipation efficiency of the vapor chamber 1 can be improved more.

According to the present embodiment, the second vapor flow channel portion 70 is disposed on one side of the land portion 33 in the X direction. In this way, when a portion in which the second vapor flow channel portion 70 is disposed serves as the evaporation region SR, it can be inhibited that the flow of the working vapor 2a evaporated in the evaporation region SR in the Y direction is blocked. As a result, diffusion of the working vapor 2a in the Y direction can be facilitated, and the heat dissipation efficiency of the vapor chamber 1 can be improved more.

According to the present embodiment, the end edge convex portion 73 in contact with the lower sheet 10 is provided between the second vapor flow channel portion 70 and one of two end edges 33b in the X direction of the land portion 33 on the side on which the second vapor flow channel portion 70 is disposed. Accordingly, the end edge convex portion 73 can be brought into contact with the lower sheet 10 and be joined to the lower sheet 10. In this manner, the mechanical strength of the vapor chamber 1 can be improved.

(First Modification)

Figure 15:
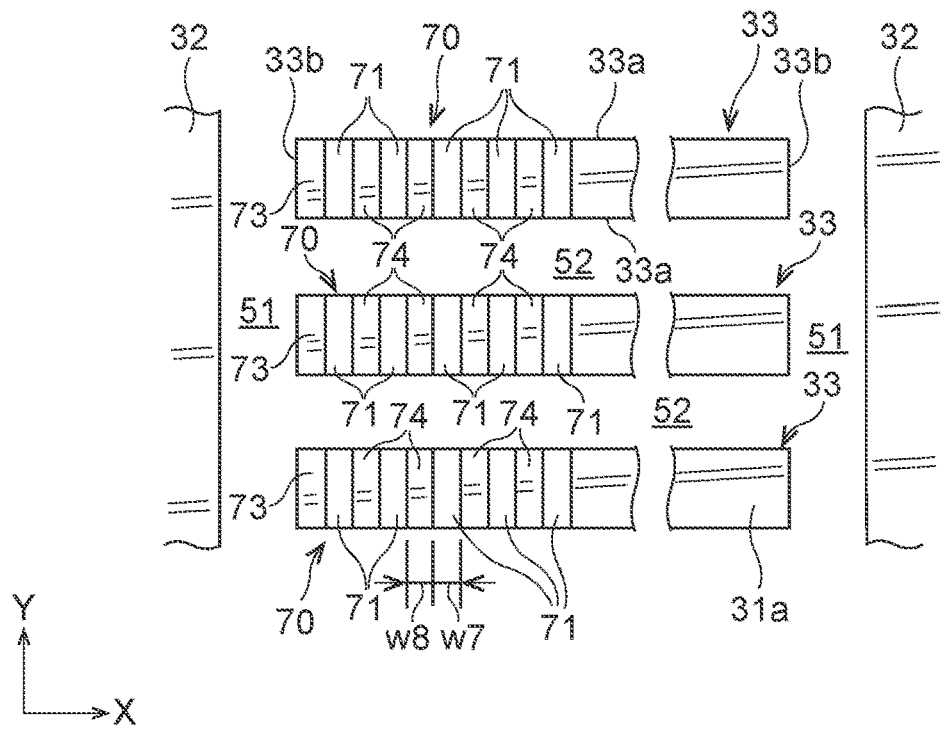
FIG. 15 is a partially enlarged bottom view of a second vapor flow channel portion according to a first modification.

The present embodiment has been described above with reference to the example in which the second vapor flow channel portion 70 provided in each of the land portions 33 includes only one vapor flow channel groove 71. However, the present embodiment is not limited thereto. For example, as illustrated in FIG. 15, the second vapor flow channel portion 70 provided in each of the land portions 33 may include a plurality of the vapor flow channel grooves 71. In this case, the plurality of vapor flow channel grooves 71 are arranged in the X direction in each of the land portions 33. In addition, a vapor flow channel convex portion 74 may be provided between two of the vapor flow channel grooves 71 adjacent to each other so as to be in contact with the lower sheet 10. FIG. 15 illustrates an example in which the dimension of the vapor flow channel groove 71 in the X direction is less than the dimension in the Y direction. However, the present embodiment is not limited thereto. In the example illustrated in FIG. 15, the planar shape of each of the vapor flow channel convex portions 74 is rectangular. The planar shape of the vapor flow channel convex portion 74 corresponds to the planar shape of the sheet body 31 at the first body surface 31a.

According to the first modification, the width w7 of the vapor flow channel groove 71 may be greater than the width w3 (refer to FIG. 9) of the liquid flow channel mainstream groove 61. The width w7 corresponds to the dimension in the X direction. The width w7 may be, for example, 30 µm to 2000 µm. The width w7 may be 30 µm to 500 µm and may be 30 µm to 200 µm. A depth h3 of the vapor flow channel groove 71 (refer to FIG. 16C) may be greater than the depth h1 (refer to FIG. 8) of the liquid flow channel mainstream groove 61. The depth h3 corresponds to the dimension in the Z direction and corresponds to h2 in FIG. 8. The depth h3 may be, for example, 25 µm to 200 µm. A width w8 of the vapor flow channel convex portion 74 may be, for example, 30 µm to 500 µm.

As described above, according to the first modification, the vapor flow channel convex portion 74 is provided between the vapor flow channel grooves 71. This can diffuse the working vapor 2a evaporated in the evaporation region SR in the Y direction and improve the mechanical strength of the vapor chamber 1.

In the example illustrated in FIG. 15, each of the vapor flow channel grooves 71 of one of the two land portions 33 adjacent to each other in the Y direction and the corresponding vapor flow channel groove 71 of the other land portion 33 are disposed so as to overlap each other as viewed in the Y direction. This allows each of the vapor flow channel grooves 71 provided in a land portion 33 to be aligned with the corresponding vapor flow channel groove 71 provided in the adjacent land portion 33. Accordingly, the working vapor 2a can be diffused in the Y direction through the vapor flow channel groove 71 provided on each of the land portion 33 and, thus, the heat dissipation efficiency of the vapor chamber 1 can be improved more.

(Second Modification)

Figure 16A:
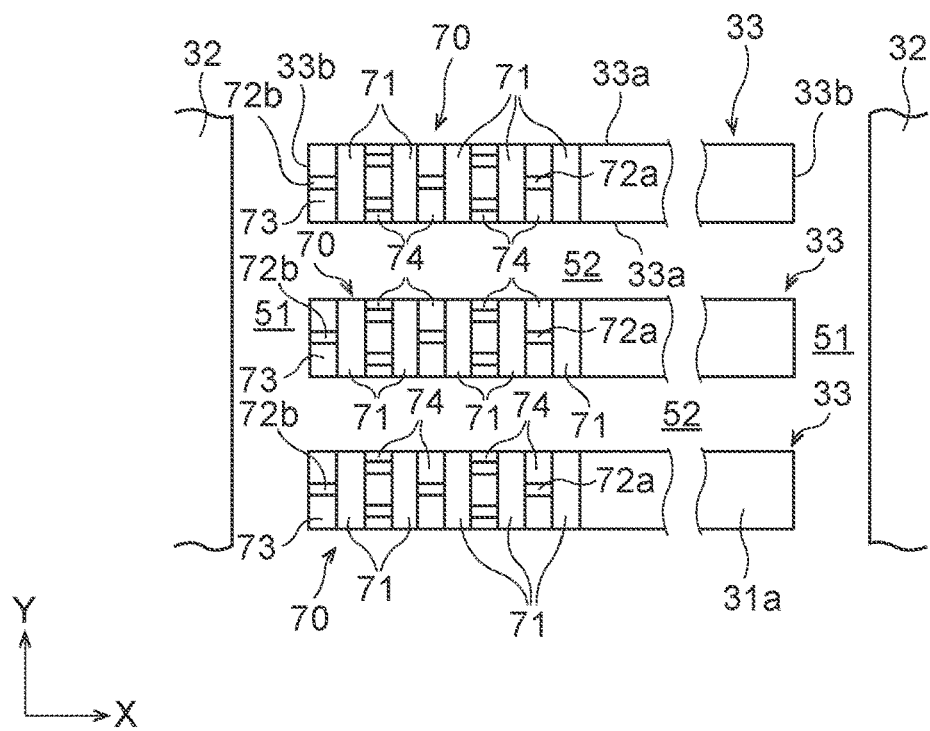
FIG. 16A is a partially enlarged bottom view of a second vapor flow channel portion according to a second modification.
Figure 16B:
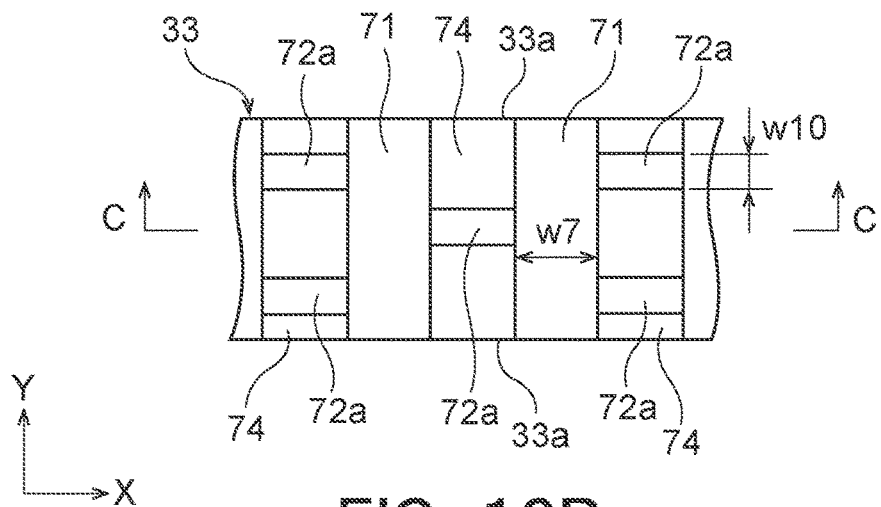
FIG. 16B is a partially enlarged bottom view of FIG. 16A.

According to the first modification described above, the second vapor flow channel portion 70 includes a plurality of the vapor flow channel groove 71, and a vapor flow channel convex portion 74 is provided between two of the vapor flow channel grooves 71 adjacent to each other. However, the configuration is not limited thereto. For example, as illustrated in FIGS. 16A and 16B, the second vapor flow channel portion 70 may include a vapor flow channel connection groove 72a provided in the vapor flow channel convex portion 74. The vapor flow channel connection groove 72a causes two of the vapor flow channel grooves 71 adjacent to each other to communicate with each other.

The vapor flow channel connection groove 72a extends in a direction different from the Y direction. As illustrated in FIGS. 16A and 16B, the vapor flow channel connection groove 72a extends in the X direction. The vapor flow channel connection groove 72a is formed so as to be orthogonal to the vapor flow channel groove 71. The flow passage cross-sectional area of the vapor flow channel connection groove 72a may be equal to that of the vapor flow channel groove 71. Alternatively, the flow passage cross-sectional area of the vapor flow channel connection groove 72a may be greater than or less than that of the vapor flow channel groove 71. The vapor flow channel connection groove 72a may be formed by an etching process in the same manner as the vapor flow channel groove 71. One or more vapor flow channel connection grooves 72a may be formed in each of the vapor flow channel convex portions 74.

As illustrated in FIGS. 16A and 16B, the vapor flow channel connection grooves 72a may be arranged in a staggered manner. More specifically, the vapor flow channel connection groove 72a provided in one of the vapor flow channel convex portions 74 adjacent to each other and the vapor flow channel connection groove 72a provided in the other vapor flow channel convex portion 74 may be disposed at positions different from the positions at which the vapor flow channel connection grooves 72a overlap each other as viewed in the X direction. In this case, these vapor flow channel connection groove 72a do not overlap each other as viewed in the X direction.

Figure 16C:
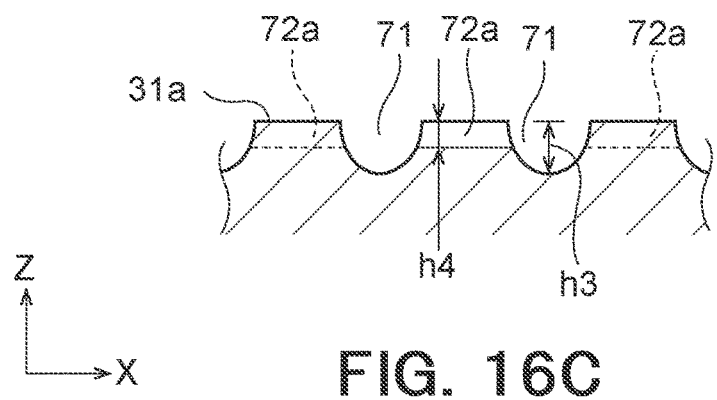
FIG. 16C is a sectional view taken along line C-C of FIG. 16B.

As illustrated in FIG. 16B, a width w10 of the vapor flow channel connection groove 72a may be equal to the width w7 of the vapor flow channel groove 71. However, the width w10 may be greater than or less than the width w7. The width w10 corresponds to the dimension in the Y direction. The width w10 may be, for example, 30 µm to 2000 µm. The width w10 may be 30 µm to 500 µm. The width w10 may be 30 µm to 200 µm. As illustrated in FIG. 16C, a depth h4 of the vapor flow channel connection groove 72a may be equal to the depth h3 of the vapor flow channel groove 71. However, the depth h4 may be greater than or less than the depth h3. The depth h4 corresponds to the dimension in the Z direction. The depth h4 may be, for example, 25 µm to 200 µm.

As illustrated in FIG. 16A, the second vapor flow channel portion 70 may include a vapor flow channel connection groove 72b provided on the end edge convex portion 73. The vapor flow channel connection groove 72b causes the vapor flow channel groove 71 to communicate with the first vapor passage 51. The vapor flow channel connection groove 72b may be formed in the same manner as the vapor flow channel connection groove 72a described above. One or more vapor flow channel connection grooves 72b may be formed in the end edge convex portion 73. The vapor flow channel connection grooves 72b may be disposed in a staggered pattern together with the vapor flow channel connection grooves 72a.

As described above, according to the second modification, the vapor flow channel convex portion 74 includes the vapor flow channel connection groove 72a that causes two vapor flow channel grooves 71 adjacent to each other to communicate with each other. This allows the working vapor 2a to diffuse in the X direction through the vapor flow channel connection groove 72a when the working vapor 2a passes through the vapor flow channel groove 71. In this manner, the working vapor 2a in the second vapor flow channel portion 70 can be diffused not only in the Y direction but also in the X direction and, thus, the heat of the electronic device D can be dissipated more.

According to the second modification, the vapor flow channel connection groove 72a provided on one of the vapor flow channel convex portions 74 adjacent to each other and the vapor flow channel connection groove 72a provided on the other vapor flow channel convex portion 74 are disposed at positions different from the positions at which the vapor flow channel connection grooves 72a overlap each other as viewed in the X direction. This allows two vapor flow channel convex portions 74 adjacent to each other in the X direction to be disposed at different positions in the Y direction. As a result, the mechanical strength of the vapor chamber 1 can be improved more.

(Third Modification)

Figure 17:
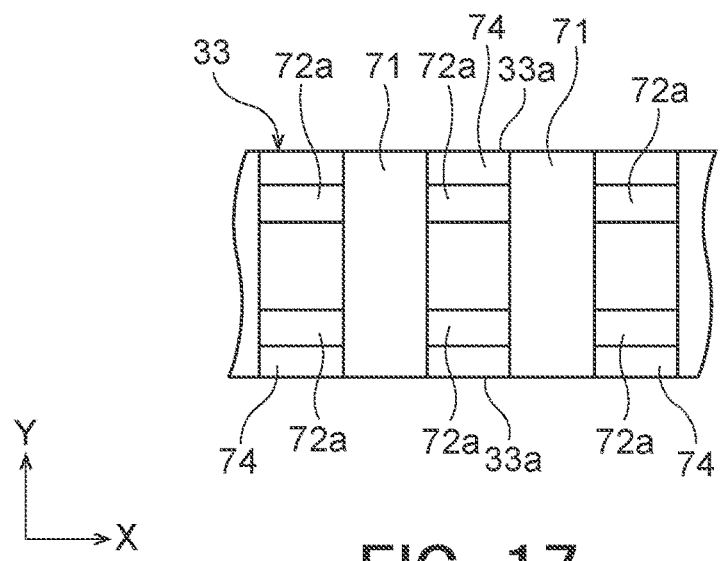
FIG. 17 is a partially enlarged bottom view of a second vapor flow channel portion according to a third modification.

The second modification above has been described with reference to the example in which the vapor flow channel connection groove 72a provided on one of the vapor flow channel convex portions 74 adjacent to each other and the vapor flow channel connection groove 72a provided on the other vapor flow channel convex portion 74 are disposed at positions different from the positions at which the vapor flow channel connection grooves 72a overlap each other as viewed in the X direction. However, the configuration is not limited thereto. For example, as illustrated in FIG. 17, the vapor flow channel connection groove 72a provided on one of the vapor flow channel convex portions 74 adjacent to each other and the vapor flow channel connection groove 72a provided on the other vapor flow channel convex portion 74 may be disposed at positions at which the vapor flow channel connection grooves 72a overlap each other as viewed in the X direction. In this case, the vapor flow channel connection grooves 72a are disposed in a grid pattern. When the vapor flow channel connection groove 72b described above is formed on the end edge convex portion 73, the vapor flow channel connection grooves 72b may be disposed in a grid pattern together with the vapor flow channel connection grooves 72a.

As described above, according to the third modification, the vapor flow channel connection groove 72a provided on one of the vapor flow channel convex portions 74 adjacent to each other and the vapor flow channel connection groove 72a provided on the other vapor flow channel convex portion 74 are disposed at positions at which the vapor flow channel connection grooves 72a overlap each other as viewed in the X direction. This allows the vapor flow channel connection groove 72a provided on the vapor flow channel convex portion 74 to be aligned with the vapor flow channel connection groove 72a provided on another adjacent vapor flow channel convex portion 74 adjacent to the vapor flow channel convex portion 74. In this manner, the working vapor 2a can be diffused in the X direction through the vapor flow channel connection grooves 72a provided on the vapor flow channel convex portions 74. As a result, the working vapor 2a in the second vapor flow channel portion 70 can be diffused in the X direction more and, thus, the heat of the electronic device D can be dissipated more.

(Fourth Modification)

Figure 18:
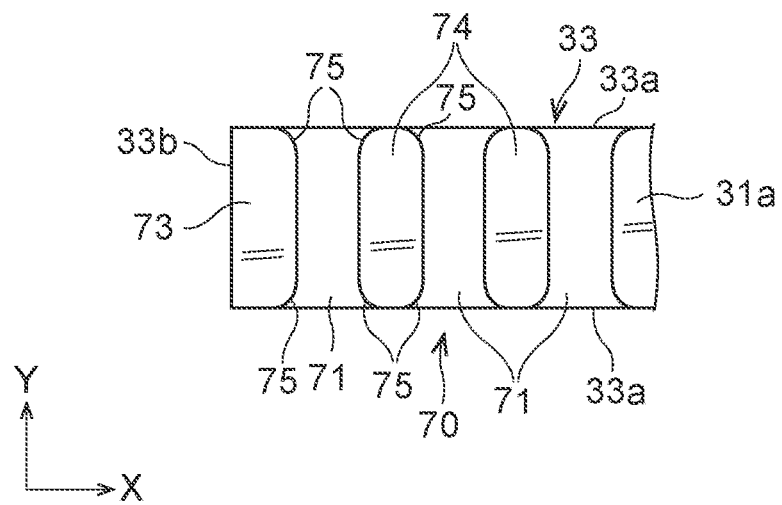
FIG. 18 is a partially enlarged bottom view of a second vapor flow channel portion according to a fourth modification.

The first modification has been described above with reference to the example in which the planar shape of each of the vapor flow channel convex portions 74 is rectangular. However, the planar shape is not limited thereto. For example, as illustrated in FIG. 18, the planar shape of each of the vapor flow channel convex portions 74 may be a rounded rectangular shape. More specifically, as illustrated in FIG. 18, each of the corners of the vapor flow channel convex portion 74 may have a rounded curved portion 75 in plan view. At both ends of the vapor flow channel convex portion 74 in the Y direction, the curved portions 75 provided in the two corners may be formed in a continuous integral manner.

As described above, according to the fourth modification, the curved portion 75 is provided at a corner of the vapor flow channel convex portion 74, so that the flow path resistance in the vapor flow channel groove 71 of the second vapor flow channel portion 70 can be reduced. This allows the working vapor 2a to flow smoothly in the Y direction. In addition, the capillary force at the corner of the vapor flow channel convex portion 74 can be reduced and, thus, the working liquid 2b can be inhibited from accumulating at the corner.

As illustrated in FIG. 18, a similar curved portion 75 may be provided at, among the corners of the end edge convex portion 73, the corners adjacent to the vapor flow channel groove 71. This can reduce the flow path resistance in the vapor flow channel groove 71 adjacent to the end edge convex portion 73 more.

(Fifth Modification)

Figure 19:
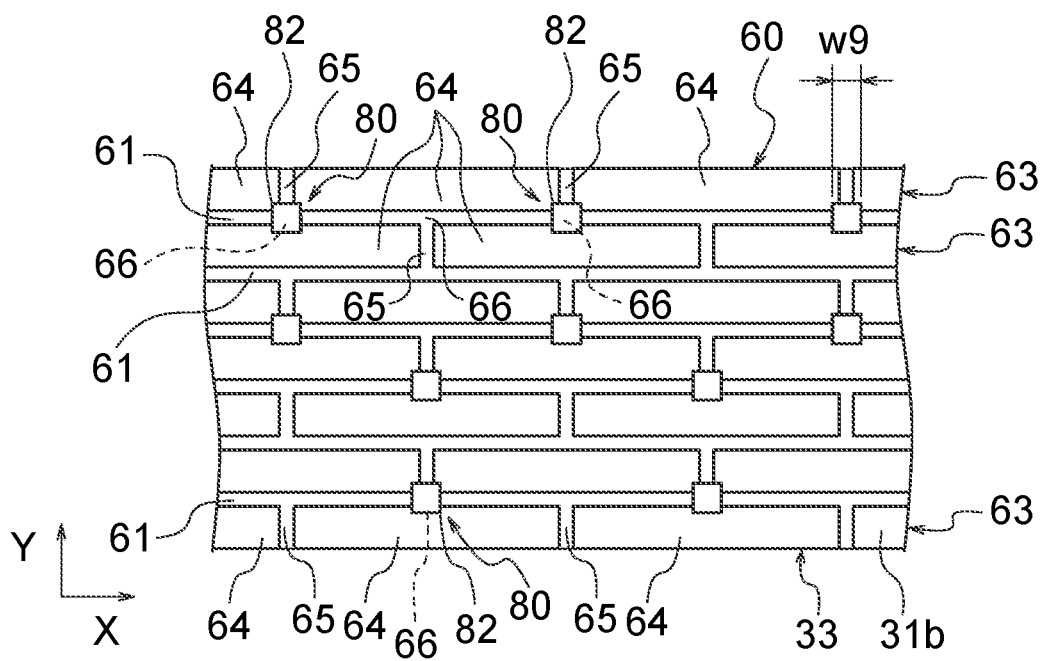
FIG. 19 is a partially enlarged top view of a liquid flow channel portion according to a fifth modification.
Figure 20:
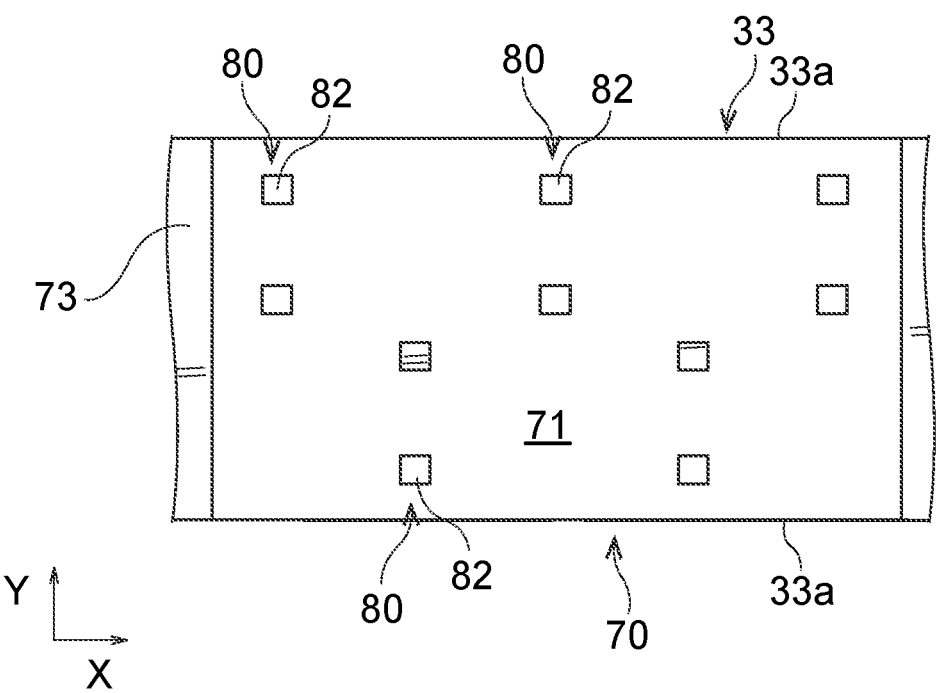
FIG. 20 is a partially enlarged bottom view of a second vapor flow channel portion according to a sixth modification.

The present embodiment has been described above with reference to an example in which the second vapor flow channel portion 70 communicates with the liquid flow channel portion 60 via the first vapor flow channel portion 50. However, the configuration is not limited thereto. For example, as illustrated in FIGS. 19 and 20, a plurality of communication portions 80 may be provided on the sheet body 31 so as to cause the liquid flow channel portion 60 to communicate with the second vapor flow channel portion 70. The communication portions 80 may be located within the evaporation region SR.

More specifically, as illustrated in FIGS. 19 and 20, the communication portion 80 may include a through-hole 82 that penetrates the sheet body 31 and extends from the liquid flow channel portion 60 to the second vapor flow channel portion 70. According to the fifth modification illustrated in FIGS. 19 and 20, the through-hole 82 is not located in the wall surface 53a of the lower vapor flow channel recess 53 or the wall surface 54a of the upper vapor flow channel recess 54, but inside the land portion 33 in plan view. FIGS. 19 and 20 illustrate an example in which the through-hole 82 is formed in a rectangular shape. However, the planar shape of the through-hole 82 may be curved, such as a circular or elliptical shape, and the planar shape may be any shape.

The through-hole 82 may extend to the liquid flow channel intersection portion 66 of the liquid flow channel portion 60 and the vapor flow channel groove 71 of the second vapor flow channel portion 70. According to the fifth modification illustrated in FIGS. 19 and 20, one end of the through-hole 82 is located at the liquid flow channel intersection portion 66 described above. The other end of the through-hole 82 is located at the vapor flow channel groove 71. The through-hole 82 need not communicate with the liquid flow channel intersection portion 66 as long as it communicates with the liquid flow channel mainstream groove 61 or the liquid flow channel connection groove 65.

As illustrated in FIG. 19, a width w9 of the through-hole 82 may be greater than the width w4 of the liquid flow channel connection groove 65 (refer to FIG. 9). The width w9 corresponds to the dimension in the X direction. This allows the capillary force that acts on the working liquid 2b in the through-hole 82 to be smaller than the capillary force that acts on the working liquid 2b in the liquid flow channel connection groove 65. In this case, the working liquid 2b can be inhibited from remaining in the through-hole 82. In addition, in this case, the through-hole 82 is formed so as to cut out part of the convex portion 64. In addition, the width w9 of the through-hole 82 may be less than the width w6 of the vapor flow channel groove 71 (refer to FIG. 10). The width w9 of the through-hole 82 may be, for example, 10 μm to 100 μm. The width w9 of the through-hole 82 refers to the dimension of the wick sheet 30 at the second body surface 31b.

As described above, according to the fifth modification, part of the working vapor 2a evaporated from the working liquid 2b due to the heat received from the electronic device D in the liquid flow channel portion 60 can pass through the communication portion 80 and reach the vapor flow channel groove 71 of the second vapor flow channel portion 70. Thus, the working vapor 2a can be diffused in the vapor flow channel groove 71 in the Y direction. That is, the working vapor 2a evaporated in the liquid flow channel portion 60 can reach the second vapor flow channel portion 70 without passing through the first vapor flow channel portion 50. Consequently, the working vapor 2a evaporated from the working liquid 2b can be smoothly diffused in the Y direction. As a result, the heat of the electronic device D can be dissipated more and, thus, the heat dissipation efficiency of the vapor chamber 1 can be improved more.

According to the fifth modification, the communication portion 80 includes the through-hole 82 that penetrates the sheet body 31 and extends from the liquid flow channel portion 60 to the second vapor flow channel portion 70. This can further reduce the resistance to the working liquid 2b flowing from the liquid flow channel portion 60 to the second vapor flow channel portion 70. As a result, the working vapor 2a evaporated in the liquid flow channel portion 60 can smoothly reach the second vapor flow channel portion 70. Furthermore, according to the fifth modification, the through-hole 82 extends to the liquid flow channel intersection portion 66 and the vapor flow channel groove 71, resulting in a further decrease in the resistance to the working vapor 2a flowing from the liquid flow channel portion 60 to the vapor flow channel groove 71.

(Sixth Modification)

Figure 21:
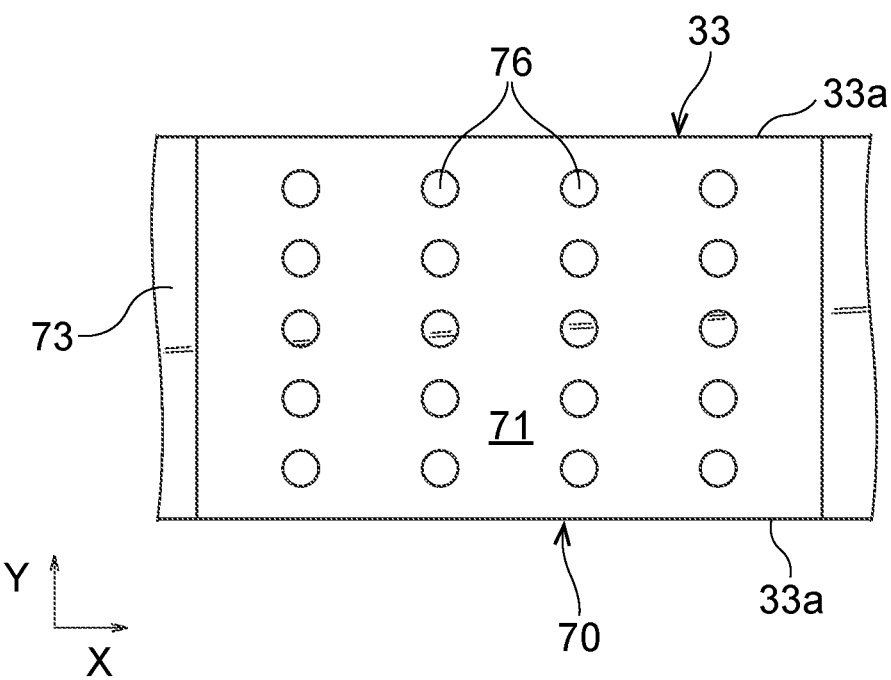
FIG. 21 is a partially enlarged bottom view of a second vapor flow channel portion according to a seventh modification.

The present embodiment has been described above with reference to the example in which the second vapor flow channel portion 70 provided in each of the land portions 33 includes a single vapor flow channel groove 71. In this case, a plurality of convex portions 76 may be provided in the vapor flow channel groove 71 so as to protrude from the land portions 33 and be in contact with the lower sheet 10. A plurality of the convex portions 76 may be provided in the vapor flow channel groove 71. The convex portion 76 may be disposed so as not to block the flow of the working vapor 2a passing through the vapor flow channel groove 71. The convex portion 76 having such a configuration may be formed in, for example, a circular shape as illustrated in FIG. 21 or elliptical shape (not illustrated) in plan view. Alternatively, the convex portion 76 may be formed in a rectangular shape (not illustrated) in plan view. In this case, unlike the vapor flow channel convex portion 74 described above, the convex portion 76 need not be extended to one or the other of the side edges 33a of the land portion 33. Furthermore, in the example illustrated in FIG. 21, the convex portions 76 are arranged along parallel lines. However, the convex portions 76 may be arranged in a staggered pattern in plan view.

(Seventh Modification)

The present embodiment has been described above with reference to the example in which the second vapor flow channel portion 70 is provided on the first body surface 31a of each of the land portions 33 of the wick sheet 30. However, the configuration is not limited thereto. The second vapor flow channel portions 70 need not be provided in all the land portions 33. For example, the second vapor flow channel portion 70 may be provided in any one of the land portions 33 only or in each of some land portions 33. For example, if the planar shape of the electronic device D is small, the second vapor flow channel portion 70 may be selectively provided in the desired land portions 33 in accordance with the region to be covered by the electronic device D. Note that the same applies to the case where the vapor chamber 1 does not have a simple rectangular shape.

The present invention is not limited to the above-described embodiments and modifications without any change, but can be embodied by changing the shapes of the components in the implementation stage without departing from the spirit and scope of the invention. In addition, various inventions can be discerned by appropriately combining the multiple constituent elements described in the above embodiments and modifications. Some constituent elements may be removed from all of the constituent elements described in the embodiments and the modifications.

The invention claimed is:

1. A wick sheet for a vapor chamber, the wick sheet being sandwiched between a first sheet and a second sheet of the vapor chamber where a working fluid is enclosed, the wick sheet comprising:
a sheet body having a first body surface and a second body surface opposite the first body surface;
a first vapor flow channel portion extending from the first body surface to the second body surface of the sheet body, vapor of the working fluid passing through the first vapor flow channel portion;
a liquid flow channel portion provided on the second body surface, the liquid flow channel portion communicating with the first vapor flow channel portion and allowing liquid of the working fluid to pass through the liquid flow channel portion; and
a second vapor flow channel portion provided on the first body surface, the second vapor flow channel portion communicating with the first vapor flow channel portion and allowing the vapor of the working fluid to pass through the second vapor flow channel portion,
wherein the sheet body includes a land portion having a longitudinal direction being a first direction, and the first vapor flow channel portion is disposed around the land portion, and
wherein the second vapor flow channel portion includes a vapor flow channel groove extending from one of side edges of the land portion to the other of the side edges in a second direction orthogonal to the first direction.

2. The wick sheet for a vapor chamber according to claim 1, wherein the second vapor flow channel portion includes a plurality of the vapor flow channel grooves, and a vapor flow channel convex portion in contact with the first sheet is provided between two of the vapor flow channel grooves adjacent to each other.

3. The wick sheet for a vapor chamber according to claim 2, wherein the second vapor flow channel portion includes a vapor flow channel connection groove that is disposed on the vapor flow channel convex portion and that allows the two of the vapor flow channel grooves adjacent to each other to communicate with each other.

4. The wick sheet for a vapor chamber according to claim 3, wherein the vapor flow channel connection groove provided on one of the vapor flow channel convex portions adjacent to each other and the vapor flow channel connection groove provided on the other of the vapor flow channel convex portions are disposed at positions different from positions at which the two of the vapor flow channel connection grooves overlap as viewed in the first direction.

5. The wick sheet for a vapor chamber according to claim 3, wherein the vapor flow channel connection groove provided on one of the vapor flow channel convex portions adjacent to each other and the vapor flow channel connection groove provided on the other of the vapor flow channel convex portions are disposed at positions at which the two of the vapor flow channel connection grooves overlap as viewed in the first direction.

6. The wick sheet for a vapor chamber according to claim 1, wherein the sheet body includes a plurality of the land portions,
wherein the second vapor flow channel portion is provided in each of the land portions, and
wherein the vapor flow channel groove of one of two of the land portions adjacent to each other in the second direction and the vapor flow channel groove of the other of the two of the land portions are disposed at positions at which the two of the vapor flow channel grooves overlap as viewed in the second direction.

7. The wick sheet for a vapor chamber according to claim 1, wherein the second vapor flow channel portion is disposed on one side of the land portion in the first direction.

8. The wick sheet for a vapor chamber according to claim 7, wherein an end edge convex portion in contact with the first sheet is provided between the vapor flow channel groove of the second vapor flow channel portion and one of two end edges of the land portion in the first direction, the one of the two end edges being located on a side on which the second vapor flow channel portion is disposed.

9. The wick sheet for a vapor chamber according to claim 1, further comprising:
   a communication portion provided in the sheet body, the communication portion communicating with the liquid flow channel portion and the second vapor flow channel portion.

10. The wick sheet for a vapor chamber according to claim 9, wherein the communication portion includes a through-hole that penetrates the sheet body and that extends from the liquid flow channel portion to the vapor flow channel groove.

11. The wick sheet for a vapor chamber according to claim 10, wherein the liquid flow channel portion includes a plurality of liquid flow channel mainstream grooves that extend in the first direction and that allow liquid of the working fluid to pass through the liquid flow channel mainstream grooves and a liquid flow channel connection groove that extends in a direction different from the first direction and that communicates with the liquid flow channel mainstream grooves,
   wherein each of the liquid flow channel mainstream grooves further includes a liquid flow channel intersection portion that communicates with the liquid flow channel connection groove, and
   wherein the through-hole extends to the liquid flow channel intersection portion and the vapor flow channel groove.

12. A wick sheet for a vapor chamber, the wick sheet being sandwiched between a first sheet and a second sheet of the vapor chamber where a working fluid is enclosed, the wick sheet comprising:
   a sheet body having a first body surface and a second body surface opposite the first body surface;
   a penetration space extending from the first body surface to the second body surface of the sheet body;
   a first body surface groove portion provided on the first body surface, the first body surface groove portion communicating with the penetration space; and
   a second body surface groove portion provided on the second body surface, the second body surface groove portion communicating with the penetration space,
   wherein the sheet body includes a land portion having a longitudinal direction being the first direction, and the penetration space is disposed around the land portion,
   wherein the first body surface groove portion includes a first groove that extends one of side edges of the land portion to the other of the side edges in a second direction orthogonal to the first direction,
   wherein the second body surface groove portion includes a second groove extending in the first direction, and
   wherein a dimension of the first groove in the first direction is greater than a dimension of the second groove in the second direction.

13. A vapor chamber comprising:
   a first sheet;
   a second sheet; and
   the wick sheet for a vapor chamber according to claim 1, the wick sheet being sandwiched between the first sheet and the second sheet.

14. A vapor chamber comprising:
   a first sheet;
   a second sheet;
   the wick sheet for a vapor chamber according to claim 1, the wick sheet being sandwiched between the first sheet and the second sheet; and
   an evaporation region in which the working fluid evaporates,
   wherein the second vapor flow channel portion is disposed in the evaporation region.

15. An electronic apparatus comprising:
   a housing;
   a device housed in the housing; and
   the vapor chamber according to claim 13, the vapor chamber being in thermal contact with the device.

* * * * *